United States Patent
Fischer et al.

(10) Patent No.: US 10,263,043 B2
(45) Date of Patent: Apr. 16, 2019

(54) COATING MADE OF A SEMICONDUCTOR MATERIAL

(71) Applicant: Siemens Aktiengesellschaft, Munich (DE)

(72) Inventors: Rene Fischer, Erlangen (DE); Andreas Kanitz, Hoechstadt (DE); Oliver Schmidt, Erlangen (DE); Sandro Francesco Tedde, Weisendorf (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 15/524,427

(22) PCT Filed: Oct. 21, 2015

(86) PCT No.: PCT/EP2015/074382
§ 371 (c)(1),
(2) Date: May 4, 2017

(87) PCT Pub. No.: WO2016/091442
PCT Pub. Date: Jun. 16, 2016

(65) Prior Publication Data
US 2018/0286923 A1      Oct. 4, 2018

(30) Foreign Application Priority Data
Dec. 11, 2014 (DE) .................. 10 2014 225 543

(51) Int. Cl.
*H01L 21/00* (2006.01)
*H01L 27/30* (2006.01)
(Continued)

(52) U.S. Cl.
CPC ............. *H01L 27/308* (2013.01); *B28B 3/00* (2013.01); *C30B 29/12* (2013.01); *G01T 1/24* (2013.01);
(Continued)

(58) Field of Classification Search
CPC ............... H01L 51/0077; H01L 27/308; H01L 51/0007; H01L 51/4253; H01L 51/442;
(Continued)

(56) References Cited

U.S. PATENT DOCUMENTS

| | | | |
|---|---|---|---|
| 5,512,753 A | 4/1996 | Thomson et al. | 250/361 R |
| 6,483,099 B1 | 11/2002 | Yu et al. | 250/214.1 |

(Continued)

FOREIGN PATENT DOCUMENTS

| | | | | |
|---|---|---|---|---|
| CN | 1715364 A | 1/2006 | | C09K 11/67 |
| CN | 102326097 A | 1/2012 | | C09K 11/00 |

(Continued)

OTHER PUBLICATIONS

McLeod, John A. et al., "Self-Alignment of the Methylammonium Cations in Thin-Film Organometal Perovskites," The Journal of Physical Chemistry Letters, vol. 5, No. 16, pp. 2863-2867, Aug. 4, 2014.

(Continued)

*Primary Examiner* — Richard A Booth
(74) *Attorney, Agent, or Firm* — Slayden Grubert Beard PLLC

(57) ABSTRACT

The present disclosure relates to coated particles. The teachings thereof may be embodied in coated particles, a method for their production, and the use of the coated particles in X-ray detectors, gamma detectors, UV detectors, or solar cells. For example, some embodiments include particles comprising: perovskite crystals of the type $ABX_3$ or $AB_2X_4$; wherein A comprises at least one monovalent, divalent, or trivalent element from the fourth or a higher period in the periodic table or mixtures thereof; B comprises a monovalent cation, the volumetric parameter of which is sufficient, with the respective element A, for perovskite lattice formation; and X is selected from the group consisting of halides (Continued)

and pseudohalides, and mixtures thereof; and a coating of at least one semiconductor material surrounding a nucleus comprising the perovskite crystals.

15 Claims, 6 Drawing Sheets

(51) Int. Cl.
| | |
|---|---|
| *G21K 4/00* | (2006.01) |
| *B28B 3/00* | (2006.01) |
| *C30B 29/12* | (2006.01) |
| *G01T 1/24* | (2006.01) |
| *H01G 9/00* | (2006.01) |
| *H01G 9/20* | (2006.01) |
| *H01L 51/00* | (2006.01) |
| *H01L 51/42* | (2006.01) |
| *H01L 51/44* | (2006.01) |

(52) U.S. Cl.
CPC .............. *G21K 4/00* (2013.01); *H01G 9/0036* (2013.01); *H01G 9/2009* (2013.01); *H01L 51/0007* (2013.01); *H01L 51/4253* (2013.01); *H01L 51/442* (2013.01); *H01L 51/0035* (2013.01); *H01L 51/0037* (2013.01); *H01L 51/0047* (2013.01); *H01L 51/0077* (2013.01)

(58) Field of Classification Search
CPC .............. H01L 51/0047; H01L 51/0037; H01L 51/0035; C30B 29/12; B28V 3/00
See application file for complete search history.

(56) References Cited

U.S. PATENT DOCUMENTS

| | | | |
|---|---|---|---|
| 8,637,831 B2 | 1/2014 | Hayden et al. | 250/370.11 |
| 2004/0129922 A1 | 7/2004 | Shibuya et al. | 252/301.36 |
| 2005/0285041 A1 | 12/2005 | Srivastava et al. | 250/361 R |
| 2006/0054863 A1 | 3/2006 | Dai et al. | 252/301.4 R |
| 2010/0168307 A1 | 7/2010 | Narishige et al. | 524/413 |
| 2011/0095266 A1 | 4/2011 | Hayden et al. | 257/21 |
| 2011/0168254 A1 | 7/2011 | Lee et al. | 136/256 |
| 2011/0183834 A1 | 7/2011 | Tanabe et al. | 501/139 |
| 2011/0190432 A1 | 8/2011 | Tanabe et al. | 524/403 |
| 2012/0001074 A1 | 1/2012 | Hardy et al. | 250/361 R |
| 2013/0032720 A1 | 2/2013 | Lee et al. | 250/361 R |
| 2015/0136232 A1 | 5/2015 | Snaith et al. | 136/263 |
| 2016/0203918 A1 | 7/2016 | Hinsch et al. | 136/256 |
| 2016/0313452 A1 | 10/2016 | Hartmann et al. | 250/361 R |
| 2016/0315263 A1 | 10/2016 | Hartmann et al. | 438/82 |
| 2016/0320494 A1 | 11/2016 | Hartmann et al. | 250/361 R |
| 2016/0327655 A1 | 11/2016 | Hartmann et al. | 250/361 R |
| 2017/0194101 A1* | 7/2017 | Karunadasa | H01G 9/2009 |
| 2018/0002354 A1* | 1/2018 | Sum | C07F 7/24 |
| 2018/0090312 A1* | 3/2018 | Pickett | H01L 33/18 |

FOREIGN PATENT DOCUMENTS

| | | | | |
|---|---|---|---|---|
| CN | 103826540 A | 5/2014 | .............. | A61B 6/12 |
| DE | 10137012 A1 | 2/2003 | .............. | G21K 1/10 |
| DE | 69528119 T2 | 6/2003 | .............. | C09K 11/06 |
| DE | 102011008422 A1 | 7/2011 | .............. | H01G 9/20 |
| DE | 102008029782 A1 | 3/2012 | .............. | H01L 51/42 |
| DE | 102010043749 A1 | 5/2012 | .............. | G01T 1/20 |
| DE | 102013200881 A1 | 7/2014 | .............. | C09K 11/00 |
| DE | 102013216848 A1 | 2/2015 | .............. | H01G 9/20 |
| DE | 102013226339 A1 | 6/2015 | | |
| DE | 102013226365 A1 | 6/2015 | | |
| DE | 102014212424 A1 | 6/2015 | .............. | C09K 11/02 |
| DE | 102014203685 A1 | 9/2015 | | |
| EP | 1628142 A2 | 2/2006 | .............. | C09K 11/77 |
| JP | 2004095387 A | 3/2004 | .............. | H01L 31/04 |
| JP | 2010024093 A | 2/2010 | .............. | C01G 25/00 |
| KR | 20110103305 A | 9/2011 | .............. | G02F 1/167 |
| WO | 2016/091442 A1 | 6/1916 | .............. | G21K 4/00 |
| WO | 2014/180780 A1 | 11/2014 | .............. | H01G 9/20 |

OTHER PUBLICATIONS

Korean Office Action, Application No. 2017063249086, 6 pages, dated Sep. 8, 2017.
Japanese Office Action, Application No. 2017524046, 2 pages, dated Sep. 25, 2017.
Chinese Office Action, Application No. 201580060243.7, 9 pages, dated Jan. 19, 2018.
Im, Jeong-Hyeok et al. "Synthesis, Structure, and Photovoltaic Property of a Nanocrystalline 2H Perovskite-Type Novel Sensitizer ($CH_3CH_2NH_3$)$PbI_3$," Nanoscale Research Letters, URL: http://www.nanoscalereslett.com/content/7/1/353, 7 pages, 2012.
Noel, Nakita K. et al., "Lead-Free Organic-Inorganic Tin Halide Perovskites for Photovoltaic Applications," Energy and Environmental Science Accepted Manuscript, 25 pages, 2012.
Dirin, Dmitry N. et al., "Lead Halide Perovskites and Other Metal Halide Complexes as Inorganic Caping Ligands for Colloidal Nanocrystals," Journal of American Chemical Society, 4 pages, 2014.
German Office Action, Application No. 102014225543.0, 7 pages, dated Jul. 7, 2015.
Jiang, Fangyuan et al., "Metal Electrode-Free Perovskite Solar Cells with Transfer-Laminated Conducting Polymer Electrode," Wuhan National Laboratory for Optoelectronics; Huazhong University of Science and Technology, Optical Society of America; vol. 23 (3), 10 pages, 2015.
International Search Report and Written Opinion, Application No. PCT/EP2015/074382, 14 pages, dated Mar. 15, 2016.
Koh, Angel T. et al, "Effective Hybrid Graphene/Carbon Nanotubes Field Emitters by Electrophoretic Deposition," Journal of Applied Physics, vol. 113, 5 pages, May 7, 2013.
Rhee, Jae Hui et al., "A Perspective of Mesoscopic Solar Cells Based on Metal Chalcogenide Quantum Dots and Organometal-Halide Perovskites," Nature Publishing Group Asia Materials, vol. 5, 17 pages Oct. 18, 2013.
Malinkiewicz, Olga et al., "Perovskite Solar Cells Employing Organic Charge-Transport Layers," Nature Photonics, vol. 8, pp. 128-132, Dec. 22, 2013.

\* cited by examiner

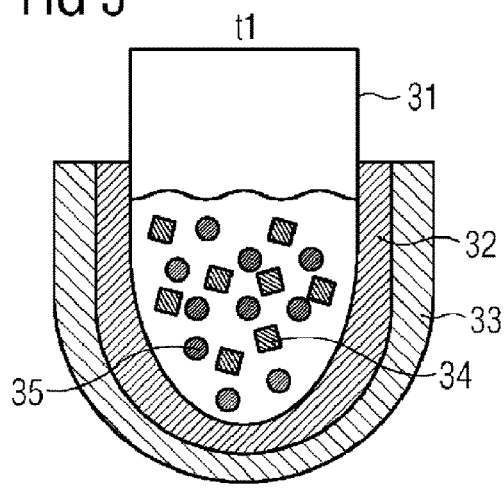
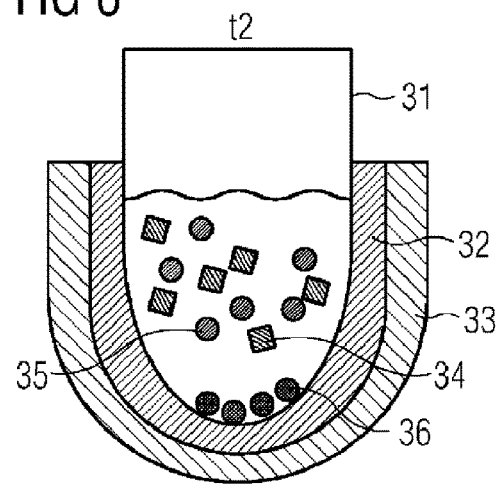
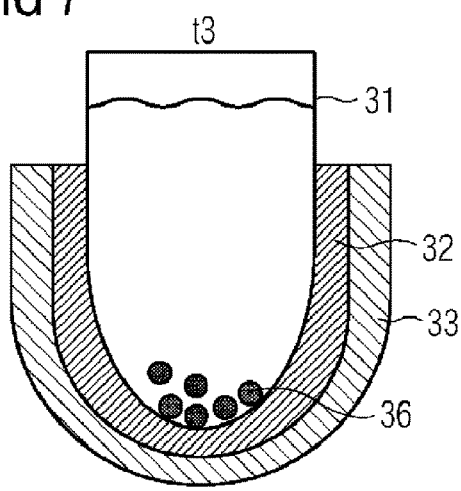
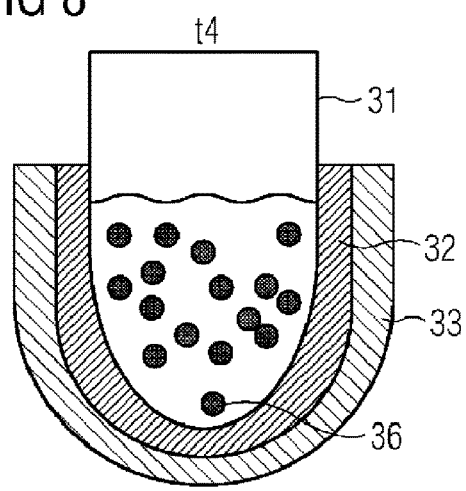
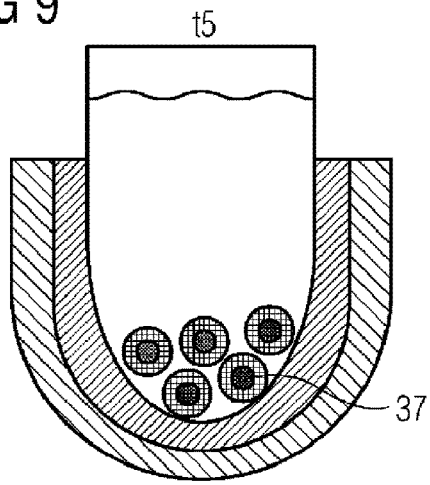

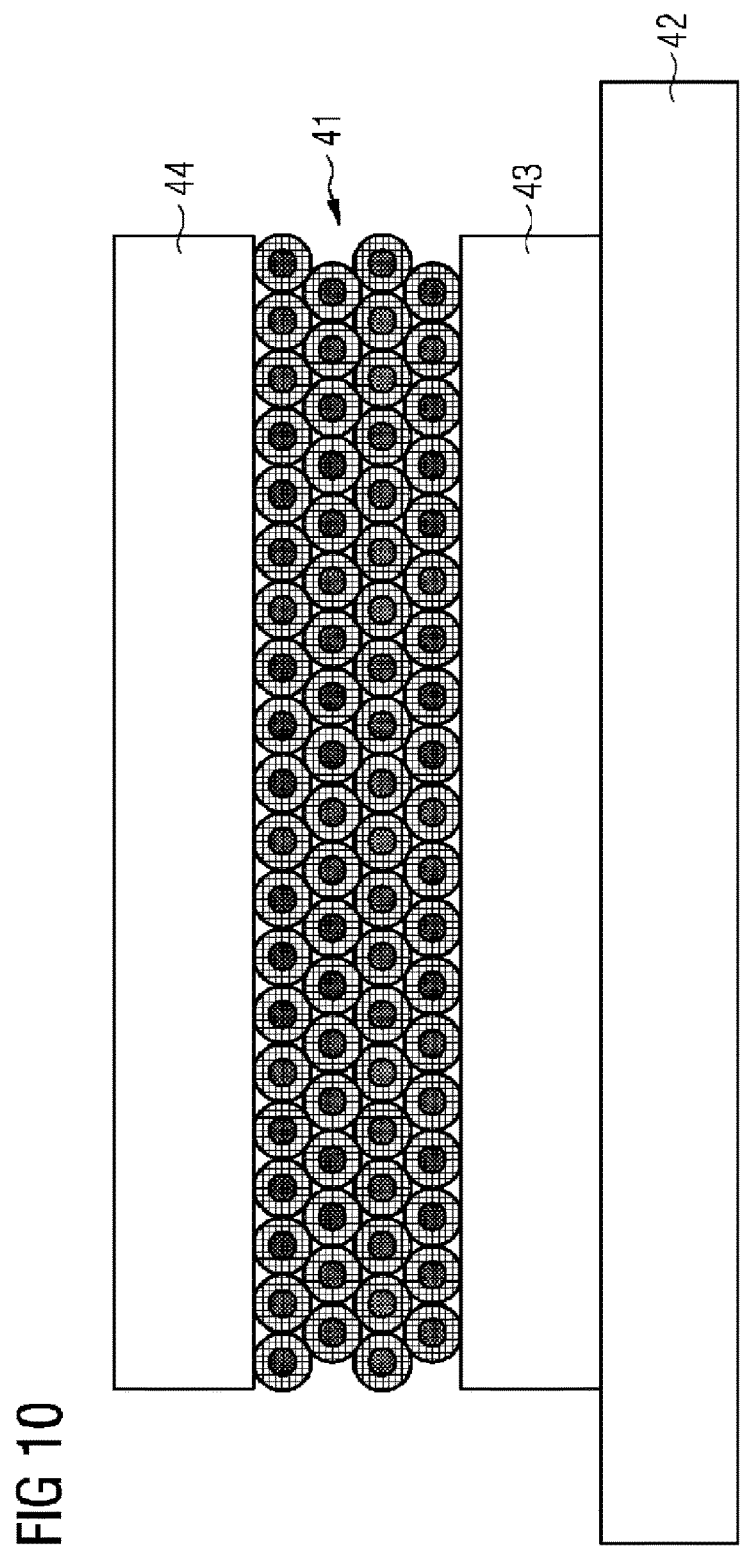

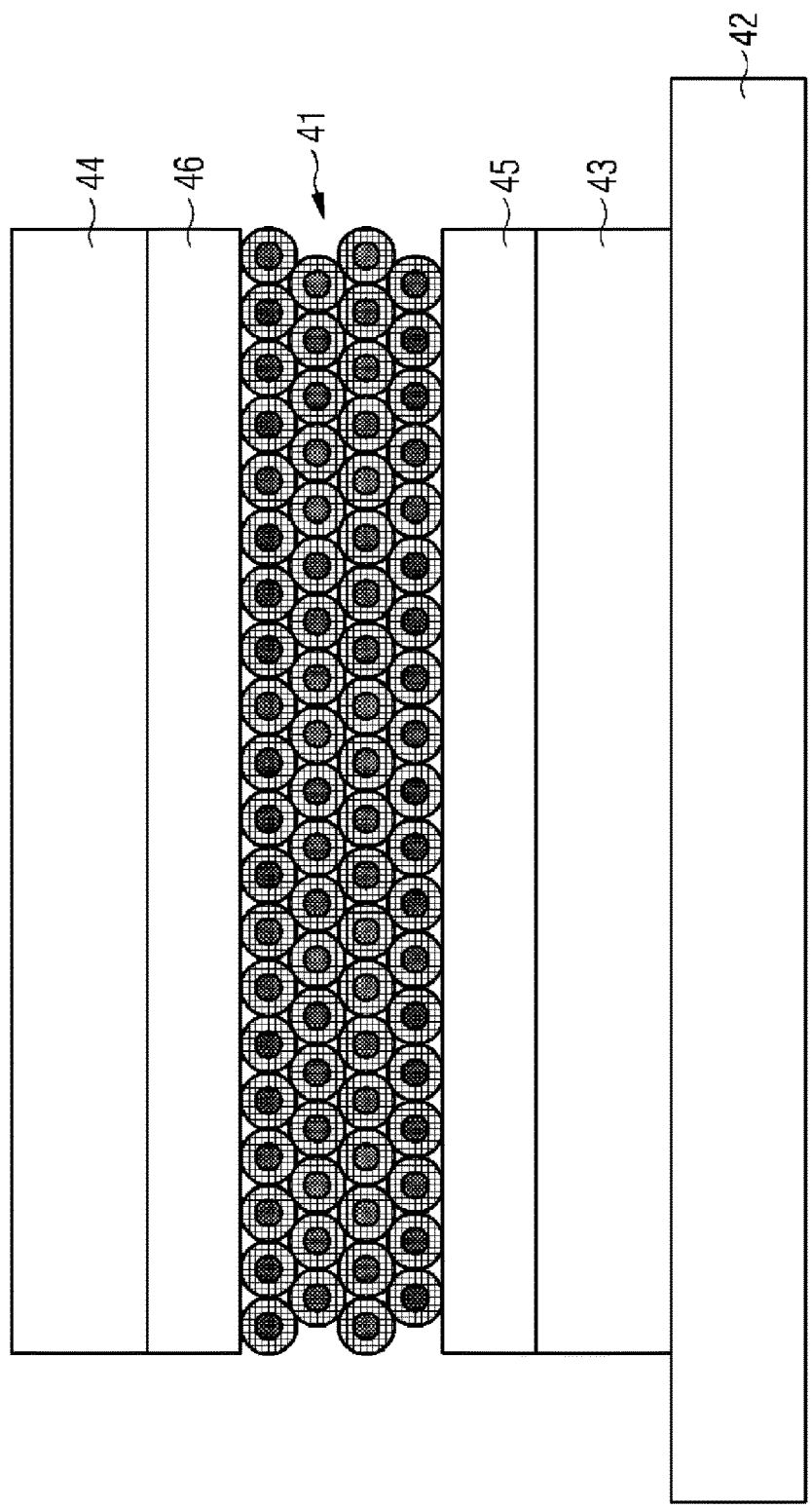

COATING MADE OF A SEMICONDUCTOR MATERIAL

CROSS-REFERENCE TO RELATED APPLICATIONS

This application is a U.S. National Stage Application of International Application No. PCT/EP2015/074382 filed Oct. 21, 2015, which designates the United States of America, and claims priority to DE Application No. 10 2014 225 543.0 filed Dec. 11, 2014, the contents of which are hereby incorporated by reference in their entirety.

TECHNICAL FIELD

The present disclosure relates to coatings for particles. The teachings thereof may be embodied in coated particles, a method for their production, and the use of the coated particles in X-ray detectors, gamma detectors, UV detectors, or solar cells.

BACKGROUND

Digital X-ray detectors may be used, inter alia, in medical diagnostics. The size of these detectors is typically between 20×20 cm² and 43×43 cm². The current state of the art includes detectors based upon amorphous silicon (using indirect conversion) and amorphous selenium (with direct conversion). The principles for direct conversion (left) and indirect conversion (right) are set out in FIG. 1. In direct conversion I, an X-ray quantum 1 excites a particle 2 and electron/hole pairs 2a, 2b are formed which then migrate to the electrodes 4 (anode and cathode, for example, pixel electrodes) and are detected there. In indirect conversion II, the X-ray quantum 1 excites the particle 2 which, in turn, emits radiation 2' with a lower energy (e.g., visible light, UV or IR radiation) which is then detected by means of a photodetector 3 (e.g., photodiode).

Indirect X-ray conversion comprises the combination of a scintillator layer (e.g., $Gd_2O_2S$ or CsI with different dopants such as terbium, thallium, europium, etc.; layer thicknesses are typically 0.1-1 mm) and a photodetector (e.g., a photodiode). The emission wavelength of the scintillator light from X-ray conversion coincides with the spectral sensitivity of the photodetector.

In direct X-ray conversion, the X-ray radiation is directly converted into electron/hole pairs and these are electronically read out (e.g., amorphous Se). Direct X-ray conversion in selenium may use up to 1 mm thick layers which are reverse biased in the kV range. Whereas indirectly converting detectors have become established in particular due to being easy and inexpensive to manufacture, direct converters have a significantly better resolving power.

An alternative X-ray detector relies on hybrid organic detectors which have conventionally been manufactured through application from the liquid phase. This enables, in particular, easy processing on large areas of up to 43×43 cm² or more. The manufacturing of detectors conventionally comprises the introduction of the inorganic absorber materials, for example, quantum dots or typical scintillator materials, into an organic matrix. Organic semiconductors can easily be applied from the liquid phase onto large surfaces and through the direct mixing-in of the inorganic scintillator granules, the optical cross-talk can be significantly minimized.

Organic semiconductors, in contrast to inorganic semiconductors, have a lower conductivity. This restricted conductivity is problematic if, as for example in X-ray absorption, very thick layers are needed to achieve a sufficient level of sensitivity. Firstly, the efficiency of the photodiode is thereby reduced, since the charge carrier extraction is impeded, secondly the speed of the photodiode is lowered, which limits a use for medical devices, for example, to the field of mammography where only soft X-ray radiation with a low penetration depth is used.

Organic semiconductors are mainly applied from the liquid phase or vapor deposited in a vacuum. All the methods known to date for mixing in inorganic absorber materials use processing from the liquid phase.

U.S. Pat. No. 6,483,099 B1 describes the possibility of an X-ray detection with a scintillator layer on an OPD (organic photodiode). Further embodiments are X-ray detection by mixing ("admixture") of scintillators into an OPD, scintillator as substrate or as part of the electrode. There is no teaching supporting introducing a scintillator homogeneously into a thick OPD layer or how an 100 μm-thick hybrid diode can be manufactured.

DE 101 37 012 A1 discloses an embodiment of a light-sensitive polymer absorber layer with embedded scintillator granules. The conductivity of the polymer layer is increased by the absorption of light from the scintillator. The mean spacing of the scintillator granules in the layer corresponds to the mean free path length of the photons from the scintillator in the polymer.

DE 10 2008 029 782 A1 describes an X-ray detector based on quantum dots mixed into the organic semiconductor matrix. In this concept, the quantum dots are dispersed in the organic semiconductor solution. Herein, oleic acid or similar is used, which can influence the electrical properties of the organic semiconductor.

DE 10 2010 043 749 A1 relates to an X-ray detector based on the concept described above, wherein scintillators are either dispersed directly in the organic semiconductor solution or are sprayed on in a co-spraying process simultaneously with the organic semiconductor material.

In the first case of fluid phase application, it may be difficult to produce a stable dispersion, in particular, for large scintillator particles. For small particles, typically, dispersants are added in order to prevent the clumping of the particles, and these negatively affect the electrical properties of the organic semiconductors.

Both methods (liquid phase application and vacuum vapor deposition) have the disadvantage that on application of very thick layers (100 μm or more), enormous quantities of solvent must be released and the layers have high roughness levels. The complete evaporation of the solvent is not only a technical challenge, but also represents a health and environmentally critical problem.

Some publications reveal that materials processed from a solution form perovskite lattice layers. Examples from publications are:

$MeNH_3I:PbI_2$ $(CH_3NH_3)Pb(I,Br)_3$ (Dirin et al. 2014, doi: 10.1021/ja5006288)

$CH_3NH_3SnI_3$ (Noel et al. 2014, doi: 10.1039/c4ee01076k)

$(CH_3CH_2NH_3)PbI_3$ (Im et al. 2014, doi: 10.1186/1556-276X-7-353)

These materials have a significantly higher charge carrier mobility than organic semiconductors and have a high X-ray absorption cross-section. However, the materials known from the literature are used in methods that were developed for solar cell research (e.g., spinning-on, blade coating, slot coating, spray coating, or vapor deposition) and typically only have a layer thickness of between 100 and 500 nm. Processing to thicker layers rapidly reaches its technological or economic limits with these processes.

Polycrystalline or monocrystalline perovskite absorber layers for use in solar cells are usually applied from the liquid phase (e.g., spinning-on, blade coating, or spraying on) or are vapor deposited in a vacuum process (e.g., PVD). In both, the formation of the crystalline structure takes place during the drying or the deposition process directly on the substrate. In addition, a mixing of inorganic absorber materials (scintillators) into the liquid phase or into a polycrystalline perovskite powder has previously not been described.

Previously known methods for manufacturing absorber powders and for mixing in inorganic absorbers relate to organic materials.

For example, from DE 102013226339.2, there is a method ("soft sintering") in which an organic photodiode is processed from a dry powder. As distinct from the methods above, the aim formulated therein is an X-ray sensitive material which can be processed with the sinter process.

In DE 102014212424.7, a method is described which, in a first step, provides for the production of core-shell powders and, in a second step, the pressing of the powder to a homogeneous film. These powders consist of particles which have a covering of organic semiconductor materials.

SUMMARY

The teachings of the present disclosure may be embodied in perovskite crystals of the type $ABX_3$ and/or $AB_2X_4$, where A is at least one monovalent, divalent or trivalent element from the fourth or a higher period in the periodic table and/or mixtures thereof; B represents a monovalent cation, the volumetric parameter of which is sufficient, with the respective element A, for perovskite lattice formation; and X is selected from among the anions of halides and pseudohalides.

For example, some embodiments may include a coated particle comprising perovskite crystals of the type $ABX_3$ and/or $AB_2X_4$, where A is at least one monovalent, divalent or trivalent element from the fourth or a higher period in the periodic table and/or mixtures thereof. In some embodiments, A is Sn, Ba, Pb, or Bi. B represents a monovalent cation, the volumetric parameter of which is sufficient, with the respective element A, for perovskite lattice formation, e.g., monovalent amino group-containing, positively charged carbon compounds, such as amidinium ions, guanidinium ions, isothiuronium ions, formamidinium ions as well as primary, secondary, tertiary and quaternized organic ammonium ions. In some embodiments, B includes a material with 1 to 10 carbon atoms. X is selected from among the halides and pseudohalides, e.g., Cl, Br, and I as well as mixtures thereof. In some embodiments, a nucleus comprising perovskite crystals is coated with at least one semiconductor material.

In some embodiments, the nucleus has a diameter of 0.01 to 200 µm, e.g., 0.1 to 100 µm, or from 1 to 10 µm. In some embodiments, the covering with at least one semiconductor material has a thickness of 1 to 1500 nm, e.g., 10 to 100 nm, or 20 to 50 nm.

In some embodiments, the nucleus further comprises at least one scintillator.

In some embodiments, the at least one scintillator in the nucleus is covered by the perovskite crystals.

In some embodiments, the semiconductor material comprises at least one electron-conducting material and/or a hole-conducting material.

Some embodiments may include methods for producing coated particles comprising perovskite crystals as described above. The method may include, bringing at least one semiconductor material into solution by means of at least one first solvent, the nuclei comprising perovskite crystals are added to the solution, subsequently, the coated particles are precipitated by the addition of a further substance and finally the first solvent and the further substance are removed.

In some embodiments, the nuclei comprising perovskite crystals are not soluble in the first solvent.

In some embodiments, the nuclei comprising perovskite crystals are added to the solution, while the solution is subjected to ultrasonic waves.

In some embodiments, the coated particles are ground to a powder following the removal of the first solvent and the further substance.

Some embodiments may include a detector, in particular an X-ray detector, a gamma detector, or a UV detector, or a solar cell comprising coated particles as described above.

Some embodiments may include methods for producing a detector, in particular an X-ray detector, a gamma detector, or a UV detector, or a solar cell. The method may include;
 a) provision of a powder comprising coated particles as described above;
 b) application of the powder to a substrate with a first electrical contact and optionally at least one first intermediate layer;
 c) application of pressure and optionally temperature for compaction of the powder;
 d) optionally application of at least one further intermediate layer; and
 e) application of a second electrical contact.

In some embodiments, in step c), before the application of the pressure for compaction of the powder, the substrate is heated.

In some embodiments, the application of pressure takes place through the use of a stamp or a roller, or isostatically.

Some embodiments may include layers, in particular for the detection of X-ray radiation, gamma radiation, or UV radiation, or for a solar cell, comprising the coated particles as described above.

Some embodiments may include methods for producing a powder comprising coated particles as described above, comprising:
 a) provision of a powder comprising coated particles;
 b) application of the powder to a substrate; and
 c) application of pressure and optionally temperature for compaction of the powder.

BRIEF DESCRIPTION OF THE DRAWINGS

The accompanying drawings are intended to illustrate embodiments of the present teachings and to impart further understanding thereof. In relation to the description, they serve to elucidate concepts and principles without limiting them. Other embodiments and many of the stated advantages are disclosed with reference to the drawings. The elements of the drawings are not necessarily shown in correct scale to one another. Identical, functionally similar and similarly acting elements, features, and components are provided in the drawings with the same reference signs, unless otherwise stated.

FIGS. 5 to 9 show schematically the production of monocrystalline or polycrystalline particles with a perovskite lattice structure with a covering of organic semiconductor according to teachings of the present disclosure.

FIG. 10 shows schematically an exemplary layer structure of an inventive X-ray detector comprising sintered, coated perovskite powder.

FIG. 11 shows schematically a further exemplary layer structure of an inventive X-ray detector comprising sintered, coated perovskite powder.

DETAILED DESCRIPTION

Figure 1:
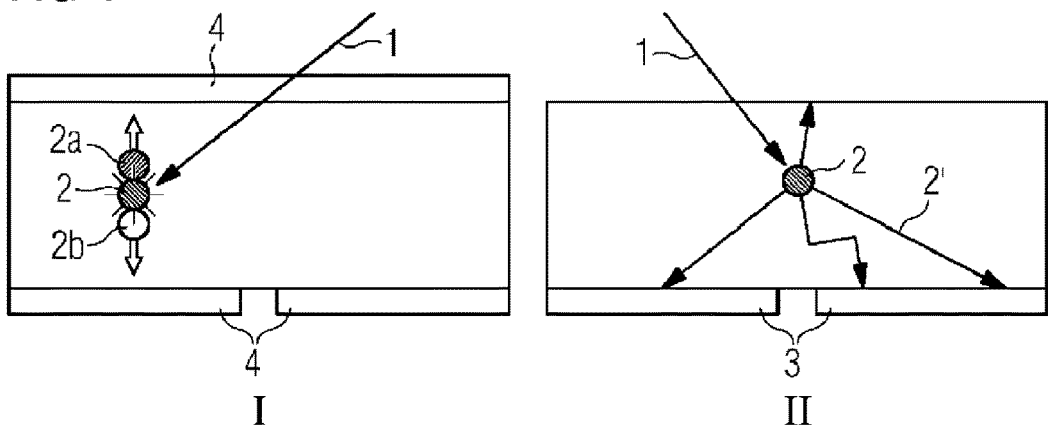
FIG. 1 shows schematically the concepts of direct X-ray conversion and indirect X-ray conversion against one another.

It has been found that, apart from visible light, polycrystalline or monocrystalline perovskite absorber layers also absorb X-ray radiation and can convert it into an electrical signal and that the perovskite crystal also has a good electrical conductivity and a high mobility. The high electrical conductivity and high charge carrier mobility is, firstly, positive for the extraction of charge carriers from the absorber layer but, secondly, causes very high leakage currents and increased dark currents resulting therefrom, which markedly limits the dynamic range of the X-ray detectors. Through a reduction of the dark currents, the dynamic range of an X-ray detector could be increased.

In addition, in a layer consisting of pure perovskite, both electron transport and hole transport take place. This can lead, with increasing layer thicknesses, to a rise in the recombination losses. Through the use of a suitable second material, the transport of the different charge carrier types could be locally separated, which lessens losses through recombination. Such a material, with good absorption and electrical conductivity, particularly of X-ray quanta, achieves a reduction in dark currents or leakage currents and lessens recombination losses.

The inventors have discovered that the object can be achieved in that the perovskite crystals are coated or covered with an organic semiconductor material. Leakage currents can be minimized in a targeted manner in that leakage paths are reduced and the transport of the respective charge carrier types (electrons and holes) is undertaken by (two) different phases (materials) (minimization of recombination). This can be achieved by means of a covering of, for example, an organic electron conductor such as PCBM around the monocrystalline or polycrystalline perovskite particle or around a monocrystalline or polycrystalline perovskite coating of an X-ray absorber.

In some embodiments, a coated particle includes perovskite crystals of the type $ABX_3$ and/or $AB_2X_4$, where A is at least one monovalent, divalent or trivalent element from the fourth or a higher period in the periodic table and/or mixtures thereof, e.g., Sn, Ba, Pb, Bi; B represents a monovalent cation, the volumetric parameter of which is sufficient, with the respective element A, for perovskite lattice formation, e.g., monovalent amino group-containing, positively charged carbon compounds, such as amidinium ions, guanidinium ions, isothiuronium ions, formamidinium ions as well as primary, secondary, tertiary and quaternized organic ammonium ions, e.g., with 1 to 10 carbon atoms; and X is selected from among the anions of halides and pseudohalides, e.g., anions chloride, bromide, and iodide as well as mixtures thereof. A nucleus comprising perovskite crystals is coated with at least one organic semiconductor material.

In some embodiments, a method for producing coated particles comprising perovskite crystals as described above includes: at least one semiconductor material is brought into solution by means of at least one first solvent, the nuclei comprising perovskite crystals are added to the solution, subsequently, the coated particles are precipitated by the addition of a further substance and finally the first solvent and the further substance are removed.

In some embodiments, a detector, in particular an X-ray detector, a gamma detector or a UV detector, or a solar cell, comprises the coated particles described above, and a method for their production, as well as a layer, for example, a detection layer comprising particles coated according to the invention, and their production method.

In some embodiments, the coated particles are used for the detection of high-energy radiation, in particular UV radiation, gamma radiation, and/or X-ray radiation and the use of the coated particles according to the invention in solar cells.

In some embodiments, a coated particle comprises perovskite crystals of the type $ABX_3$ and/or $AB_2X_4$, where A is at least one monovalent, divalent, or trivalent element from the fourth or a higher period in the periodic table and/or mixtures thereof, e.g., Sn, Ba, Pb, Bi; B represents a monovalent cation, the volumetric parameter of which is sufficient, with the respective element A, for perovskite lattice formation, e.g., monovalent amino group-containing, positively charged carbon compounds, such as amidinium ions, guanidinium ions, isothiuronium ions, formamidinium ions as well as primary, secondary, tertiary and quaternized organic ammonium ions, in some examples with 1 to 10 carbon atoms; and X is selected from among the anions of halides and pseudohalides, e.g., the anions chloride, bromide, and iodide as well as mixtures thereof, wherein a nucleus comprising perovskite crystals is coated with at least one semiconductor material.

The perovskite crystals of the type $ABX_3$ and/or $AB_2X_4$ are not particularly restricted, provided A is at least one monovalent, divalent, and/or trivalent, positively charged element from the fourth or a higher period in the periodic table and/or mixtures thereof, thus also the fifth, sixth and seventh period including the lanthanides and actinides, wherein the fourth period of the periodic table begins with K and comprises the transition metals starting with Sc; B represents a monovalent cation, the volumetric parameter of which is sufficient, with the respective element A, for perovskite lattice formation; and X is selected from among the anions of halides and pseudohalides, e.g., the anions chloride, bromide, iodide, and mixtures thereof.

In some embodiments, A comprises a divalent and/or trivalent element from the fourth or a higher period of the periodic table. In some embodiments, in the formulae above, A comprises Sn, Ba, Pb, Bi, or mixtures thereof. The perovskite crystals can thus comprise mixtures of different elements from the fourth or a higher period, thus for example, two different divalent elements or also a mixture of monovalent and divalent elements. In some embodiments, the perovskite crystals comprise only one element from the fourth or a higher period of the periodic table, e.g., Sn, Ba, and Pb, as well as mixtures thereof, in particular, divalent cations of these elements.

B represents a monovalent cation, the volumetric parameter of which is sufficient, with the respective element A, for perovskite lattice formation. Herein, the corresponding volumetric parameters for the perovskite lattice formation are sufficiently well known, both theoretically and also, for example, from X-ray crystallographic investigations, as are the volumetric parameters of monovalent cations and the cations defined under A. Thus, the corresponding monovalent cation B can suitably be determined after determination of the elements A and possibly C, for example, on the basis of computer models and possibly simple experiments. In some embodiments, B represents a monovalent amino group-containing, positively charged, carbon compound, wherein a carbon compound is a compound which has at least one carbon atom and thus comprises organic and also inorganic compounds. In some embodiments, B is selected from the group consisting of amidinium ions, guanidinium ions, isothiuronium ions, formamidinium ions, and primary, secondary, tertiary and/or quaternized organic ammonium ions. In some embodiments, B has 1 to 10 carbon atoms, e.g., 1 to 4 carbon atoms, wherein these can be aliphatic, olefinic, cycloaliphatic, and/or aromatic carbon compounds.

In some embodiments, X is selected from the anions of halides and pseudohalides, e.g., the anions chloride, bromide, and iodide and mixtures thereof. Thus, for example, different halide ions can be contained in the perovskite crystals, although in some embodiments, only one halide ion, for example iodide, is included.

Materials of the general formula $ABX_3$ and $AB_2X_4$ can crystallize in the perovskite lattice where A is a divalent element from the fourth or a higher period in the periodic table, B is any monovalent cation, the volumetric parameter of which is sufficient, with the respective element A, for perovskite lattice formation, and X corresponds to the halide ions iodide, bromide or chloride or mixtures thereof. In some embodiments, in the layer, for example the detection layer, both perovskite crystals of the general formula $ABX_3$ and also of the general formula $AB_2X_4$ are present, although only crystals according to one of the two formulae can be present.

The perovskite crystals may include the following materials mixed in molar ratio:

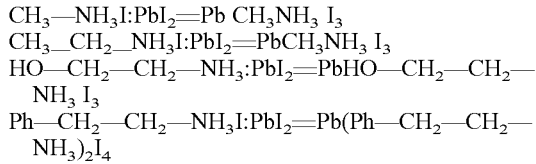

The perovskite crystals are not particularly restricted in their size and shape. The perovskite crystals can be present monocrystalline or polycrystalline. In some embodiments, the perovskite crystals are also homogenous. Furthermore, the perovskite crystals can also be present as mixed crystals, although in some embodiments no mixed crystals are present.

In some embodiments, the nucleus consists of perovskite crystals wherein one or more perovskite crystals can herein be contained within the nucleus. For a particularly simple production of the coated particles, only one type of perovskite is included.

In some embodiments, the semiconductor material is selected, such that in the case of an electron-transporting semiconductor, the electron transfer from the perovskite into the semiconductor is favored and in the case of a hole-transporting semiconductor, the hole transfer from the perovskite into the semiconductor is favored. In some embodiments, the semiconductor material comprises at least one electron-conducting material and/or a hole-transporting material. The electron-transporting material or the hole-transporting material are herein not particularly restricted. Leakage currents can be minimized in a targeted manner in that leakage paths are reduced and the transport of the respective charge carrier type (electrons and holes) is undertaken by one or, if relevant, two different phases (e.g., materials of the covering), so that minimization of recombinations is achieved.

This can be achieved by means of a covering of the nucleus comprising perovskite crystals, for example, the monocrystalline or polycrystalline perovskite particle or a monocrystalline or polycrystalline perovskite coating of an X-ray absorber/scintillator, e.g. with an organic electron conductor such as PCBM.

Energy-level schematics of perovskite materials and scintillators as well as, for example, organic semiconductor materials are also known in the literature, for example, from O. Malinkiewicz, doi: 10.1038/NPHOTON.2013.341.

The semiconductor material can be either inorganic or organic. A typical representative of a good organic hole conductor or strong electron donor (with low electron affinity) is the conjugated polymer poly-(3-hexylthiophene) (P3HT). Typical materials for organic electron conductors or electron acceptors (high electron affinity) are fullerenes such as C60 and their derivatives, for example, [6,6]-phenyl-$C_{61}$butyric acid methyl ester (PCBM). Apart therefrom, however, materials such as polyphenylene vinylenes and their derivatives, such as the cyano derivative CN-PPV, MEH-PPV (poly(2-(2-ethylhexyloxy)-5-methoxy-p-phenylene-vinylene)), CN-MEH-PPV, or phthalocyanin, PEDOT:PSS, TFB (poly(9,9-di-n-dioctylfluorene-alt-(1,4-phenylene-((4-sec-butyl phenyl)imino)-1,4-phenylene) or poly[(9,9-dioctylfluorenyl-2,7-diyl)-co-(4,4'-(N-(p-butyl phenyl))di-phenylamine)] etc. can also be used. Exemplary compounds are poly[2-methoxy-5-(2-ethylhexyloxy)1,4-phenylene-vinylene] (MEH-PPV) or poly[2-methoxy-5-(3', 7'-dimethyloctyloxy -dimethyloctyloxy)-1,4-phenylene-vinylene] (MDMO-PPV), which has a good absorption in the range 460-520 nm, wide-band gap semiconductors (semiconductors with a large band gap) such as poly[(9,9-di-n-octylfluorenyl-2,7-diyl)-alt-(benzo[2,1,3]thiadiazole-4,8-diyl)] (F8BT) (absorption maximum at 460 nm) or other polyfluorene-(PFO) polymers and co-polymers (absorption at 380-460 nm) and absorbers as developed for OPV (organic photovoltaics), for example poly[2,1,3-benzothiadiazole-4,7-diyl[4,4-bis(2-ethylhexyl)-4H-cyclopenta[2,1-b:3,4-b']dithiophene-2,6-diyl]] (PCPDTBT), squaraines (e.g. hydrazone end-capped symmetrical squaraines with glycolic functionalization or diazulene squaraine), polythieno[3,4-b] thiophene (PTT), poly(5,7-bis(4-decanyl-2-thienyl)-thieno (3,4-b)diathiazole-thiophene-2,5) (PDDTT). n-doped ZnO should be mentioned as an inorganic electron conductor and, as an inorganic hole conductor, p-doped $MoO_3$.

The material which assumes the electron transport may be selected such that its lowest unoccupied molecular orbitals (LUMO) are energetically matched to the conduction band of the perovskite. This means that the material has a lower or at most identical energy level in the band diagram, so that the transition of the electrons to the transporter is energetically favored. For the perovskite ($CH_3NH_3PbI_3$) proposed here, by way of example, with a conduction band at −3.9 eV offers itself as an electron transport material, e.g. PCBM, with a LUMO at −3.9 eV. On selection of a suitable hole transport material, the energetic position of the highest unoccupied state (highest occupied molecular orbitals, HOMO) must lie above or at most at the same level as the valency band of the perovskite. As an example, P3HT was selected with a HOMO of −5.1 eV and the valency band of the perovskite at −5.4 eV. As alternative hole transporters, PEDOT:PSS with a HOMO level at −5.2 eV, poly-TPD (HOMO: −5.4 eV, LUMO: −2.4 eV) or TFB (−5.1 eV, −2.0 eV) can be used.

In some embodiments, an organic semiconductor material can also comprise more than one semiconductor compound. In some embodiments, a detector can comprise more than one type of coated particles. Furthermore, in some embodiments, the layer of semiconductor material includes an electro-optically active layer.

In some embodiments, the covering with the semiconductor material covers the nucleus comprising perovskite crystals in the coated particle not necessarily to 100%, e.g., not more than 80% and not more than 50% of its whole outer surface. In some embodiments, the nucleus comprising perovskite crystals is not completely coated or covered, so that in a later layer, current conducting percolation paths out of the perovskite phase and the phase of the semiconductor material can form.

In some embodiments, the nucleus comprising perovskite crystals has a diameter of 0.01 to 200 μm, for example 0.05 to 200 μm, e.g., 0.1 to 100 μm, or from 0.1 to 30 μm, or from 1 to 10 μm. This diameter can suitably be determined according to optical (e.g., dynamic light scattering, DLS) electron microscopic or electrical analysis methods (e.g., Coulter counter) and thus adjusted. With decreasing diameter of the particles, the emission strength generally declines.

In some embodiments, the nucleus comprising perovskite crystals has a diameter of 0.1-30 μm, e.g., 1-10 μm, which is matched to the interaction length of high-energy electrons released by X-ray quanta. For the detection of UV radiation, the fall is less severe, so that smaller particles of up to 10 nm diameter can also be used. The size of the crystal is herein the mean crystal diameter, as can be determined, for example by measuring methods such as scanning electron microscopy. The deviation from the mean crystal diameter in the perovskite crystals in every direction can herein be, for example, less than 50% as compared with the mean crystal diameter. Thus, for example, in the production of perovskite powder of the composition $CH_3NH_3PbI_3$, a size distribution of 3-8 μm with a mean crystal diameter of 5 μm results.

In some embodiments, the covering with at least one semiconductor material has a thickness from 1 to 1500 nm, e.g., 10 to 100 nm, or 20 to 50 nm. At these thicknesses of the covering, a good reduction in the leakage current can be achieved. Conceptually, these values should be understood to be the thickness of a complete shell with a constant thickness and can be used to determine the mass ratio at a known density of the materials. However, this should not be understood as a restriction. The covering of the nucleus with the semiconductor material can be inhomogeneous and incomplete.

In some embodiments, the coated particles of the present invention can comprise in the nucleus at least one scintillator. Herein, the way in which the scintillator is contained in the nucleus is not particularly restricted. Thus, the perovskite crystals and the scintillators in the nucleus can be mixed or form delimited regions, for example, a scintillator nucleus that is surrounded by a perovskite crystal shell.

The scintillator is herein not particularly restricted and can comprise such as are commonly used in detectors, such as X-ray detectors. The scintillator or X-ray absorber herein therefore also comprises quantum dots, but also other inorganic or organic scintillators.

In some embodiments, in particular embodiments in which at least one scintillator is also contained in the nucleus, the semiconductor material is present in the layer in the form of a donor/acceptor mixture. The donor/acceptor mixture is herein also designated a bulk heterojunction.

In some embodiments, the perovskite crystals absorb radiation in a wavelength range in which the scintillator particles emit radiation. In some embodiments, the perovskite crystals also have at least one absorption maximum at a wavelength which corresponds to an emission wavelength of the scintillator particle, e.g., the emission wavelength of a maximum of the emission of the scintillator particle.

Exemplary material combinations for a combination of scintillator particles with perovskite crystals for different wavelengths are as follows:

Suitable green scintillators are, for example, $Gd_2O_2S$:Pr, Ce (gadolinium oxysulfide, doped with praseodymium and cerium with an emission maximum at approximately 515 nm), $Gd_2O_2S$:Tb (gadolinium oxysulfide, doped with terbium, having an emission maximum at approximately 545 nm), $Gd_2O_2S$:Pr,Ce,F (gadolinium oxysulfide, doped with praseodymium or cerium or fluorine, having an emission maximum at approximately 510 nm), YAG:Ce (yttrium aluminum garnet doped with cerium, having an emission maximum at approximately 550 nm), CsI:Tl (cesium iodide, doped with thallium, having an emission maximum at approximately 525 nm), $CdI_2$:Eu (europium-doped cadmium iodide, having an emission maximum at approximately 580 nm) or $Lu_2O_3$:Tb (lutetium oxide doped with terbium, having an emission maximum at approximately 545 nm), are distinguished by an emission maximum in the range of 515-580 nm and are therefore well suited to the absorption spectrum of ($CH_3NH_3$)$PbI_3$ at 450-750 nm. The scintillator $Bi_4Ge_3O_{12}$ or BGO (bismuth germanate with an emission maximum at approximately 480 nm) can be combined well with ($CH_3NH_3$)$BrI_3$ or ($CH_3NH_3$)$PbI_3$, which have good absorption in the range of 460-510 nm.

Suitable blue scintillators may include $Lu_2SiO_5$:Ce or LSO (cesium-doped lutetium oxyorthosilicate, having an emission maximum at approximately 420 nm), $Lu_{1.8}Y_{.2}SiO_5$:Ce (cerium-doped lutetium oxyorthosilicate, having an emission maximum at approximately 420 nm), $CdWO_4$ (cadmium tungstate, having an emission maximum at approximately 475 nm), CsI:Na (cesium iodide doped with sodium, having an emission maximum at approximately 420 nm), or NaI:Tl (thallium-doped sodium iodide, having an emission maximum at approximately 415 nm), $Bi_4Ge_3O_{12}$ or BGO (bismuth germanate, having an emission maximum at approximately 480 nm), $Gd_2SiO_5$ or GSO (gadolinium oxyorthosilicate doped with cerium, having an emission maximum at approximately 440 nm), or CsBr:Eu (cesium bromide doped with europium, having an emission maximum at approximately 445 nm), which can be combined well with the perovskites mentioned.

Red scintillators such as $Lu_2O_3$:Eu (lutetium oxide doped with europium, having an emission maximum at approximately 610-625 nm), $Lu_2O_3$:Tb (lutetium oxide doped with terbium, having an emission maximum at approximately 610-625 nm) or $Gd_2O_3$:Eu (gadolinium oxysulfide doped with europium, having an emission maximum at approximately 610-625 nm), YGdO:(Eu,Pr) (europium and/or praseodymium-doped yttrium gadolinium oxide, having an emission maximum at approximately 610 nm), GdGaO:Cr, Ce (chromium and/or cesium-doped gadolinium gallium oxide), or CuI (copper iodide, having a emission maximum at approximately 720 nm) can be combined well with $(CH_3NH_3)PbI_3$.

In some embodiments, the following pairs are used: $Gd_2O_2S$:Tb or YAG:Ce in combination with $(CH_3NH_3)PbI_3$ or $(CH_3NH_3)BrI_3$, $Lu_2SiO_5$:Ce in combination with $CH_3NH_3)PbI_3$ or $(CH_3NH_3)BrI_3$ or YGdO:Eu with $CH_3NH_3)PbI_3$.

In some embodiments, the mixing ratio of the perovskite and the at least one scintillator in the nucleus is 4:1 to 1:10, e.g., 1:1 to 1:4, related to the weights of the respective components. The mixing ratios (in weight %) are influenced herein by the absorption coefficients of the perovskite in the emission maximum of the scintillator and the density of the material.

In some embodiments, the covering of the nucleus comprises perovskite crystals and possibly scintillators with the semiconductor material. In known methods for embedding particles in a semiconductor matrix, the structure formation only takes place during the drying process. The particles and the semiconductor material are simultaneously applied from the liquid phase onto a substrate. The structure forms during the drying.

Figure 2:
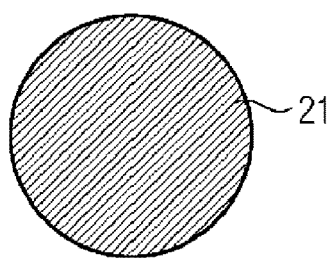
FIG. 2 shows schematically a monocrystalline or polycrystalline particle with a perovskite lattice structure.
Figure 3:
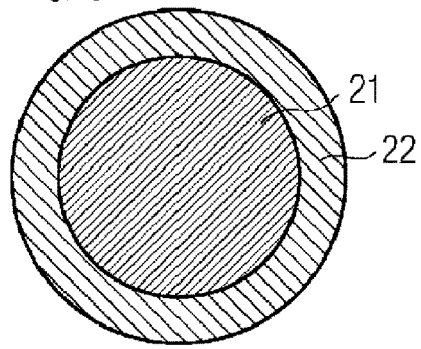
FIG. 3 shows schematically a monocrystalline or polycrystalline nucleus with a perovskite lattice structure with a covering or shell of organic semiconductor according to teachings of the present disclosure.

Some embodiments include a material with a perovskite crystal particle 21 as the nucleus, as shown in FIG. 2 as a monocrystalline or polycrystalline particle with a perovskite lattice structure, coated with, for example, an organic semiconductor covering 22, as FIG. 3 shows. This material can be present as a powder in which particles with a type of core-shell structure are present. The semiconductor covering 22 can herein have, for example, one, for example organic, semiconductor, or a mixture of a plurality of semiconductors. The material can be used, for example, for X-ray detection.

Figure 4:
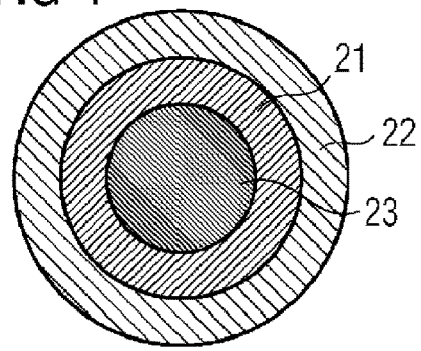
FIG. 4 shows schematically a further embodiment of the present invention in which a nucleus of X-ray absorber/scintillator with a monocrystalline or polycrystalline coating with a perovskite lattice structure, again with a covering of organic semiconductor.

In some embodiments, the at least one scintillator in the nucleus is covered by the perovskite crystals. The covering with the semiconductor material is then attached thereto. An exemplary representation of such embodiments is shown in FIG. 4 wherein a scintillator nucleus 23 is covered with perovskite crystal particles 21 and this shell is also coated or covered with a semiconductor covering 22. The semiconductor covering 22 can herein also have an organic semiconductor or a mixture of a plurality of organic semiconductors. The material can also be used for X-ray detection.

In some embodiments, the covering of perovskite crystals covers the at least one scintillator. In such embodiments, for example, to at least 80%, e.g., at least 90% and, e.g., to at least 95% of the outer surface of the at least one scintillator. In some embodiments, the at least one scintillator is covered completely, that is, to 100% by perovskite crystals. The covering with the semiconductor material covers the nucleus made of scintillator comprising the perovskite crystal shell in the inventive coated particle, not necessarily to 100%, e.g., not more than 80% or not more than 50% of its whole outer surface. In some embodiments, the perovskite crystal shell is not completely coated or covered with the semiconductor material, so that in a later layer, current conducting percolation paths out of the perovskite phase and the phase of the semiconductor material can form.

The perovskite crystal particle 21 shown by way of example in FIGS. 2 to 4 can be present as a monocrystalline or polycrystalline particle with a perovskite lattice structure wherein the structure, as shown in FIGS. 2 to 4, can be regular and equal in all directions, so that a cubic or spherical crystal particle is produced, although other regular or irregular crystal particle forms are also conceivable. Thus both the semiconductor covering and also the perovskite crystal shell 21 in FIG. 4 can be irregular due to a crystalline basic structure of the perovskite crystals 21 or the scintillators 23 can be irregular, although they can also be almost even and, for example, result in an approximately spherical form, both for the scintillator nucleus and also the perovskite shell and possibly, at least partially, for the semiconductor covering.

In some embodiments, the size of the nucleus comprising perovskite crystals, that is, a perovskite crystal nucleus or a nucleus comprising perovskite crystals and at least one scintillator, is adapted to the physical interaction mechanisms. For example, in the field of medical X-ray imaging, X-ray energies of between 10 and 150 keV are typically used. In this energy range, in the X-ray absorption process, the photoelectric effect is dominant, e.g., due to the absorption of an X-ray quantum, a highly energetic electron is knocked out of the atomic orbital and moves in the perovskite nucleus or the scintillator crystal or the perovskite crystal shell.

In a plurality of collision processes, this high energy electron generates excited states in the nucleus or the scintillator crystal. In the scintillator, the excited states recombine and emit visible light which, in turn, is absorbed in the perovskite crystal shell can generate excited states there. The excited states in the perovskite are long-lived and can be separated by means of the externally applied electric field or at the interface to the, preferably organic, semiconductor into free electrons or holes and can be detected as current. The penetrating depth of the high energy electron is typically in the range of a few μm, and accordingly, a particle diameter, for example, of 1-10 μm provides a good starting basis. In smaller particles, a portion of the kinetic energy of the photoelectron could be lost, while larger particles are conceivable from optical considerations, but limit the electrical efficiency of later components.

The semiconductor covering has s thickness related to the transport properties of the different materials more than by the optical absorption properties. The quantity of semiconductor material determines the thickness and number of the interfaces between the perovskite and the semiconductor and thus contributes to the reduction of the dark current. In some embodiments, the covering with at least one semiconductor material has a thickness from 1 to 1500 nm, e.g., 10 to 100 nm, or 20 to 50 nm. At these thicknesses of the covering, a good reduction in the leakage current can be achieved. Conceptually, these values should be understood to be the thickness of a complete shell with a constant thickness and can be used in order to determine the mass ratio at a known density of the materials. However, this should not be understood as a restriction. The covering of the nucleus with the semiconductor material can be inhomogeneous and incomplete.

In some embodiments, in the covering of the nucleus with the semiconductor material, further substances such as, for example, scintillators as described above, are mixed in.

In some embodiments, a method for producing coated particles comprising perovskite crystals of the type described above includes: a nucleus comprising perovskite crystals is coated with at least one semiconductor material, wherein the at least one semiconductor material is brought into solution by means of at least one first solvent, the nuclei comprising perovskite crystals are added to the solution, subsequently, the coated particles are precipitated by the addition of a further substance and finally the first solvent and the further substance are removed.

During the production of the coated particles comprising perovskite crystals in some embodiments, the at least one semiconductor material or a mixture of semiconductor materials is brought into solution by means of at least one first solvent. The nuclei comprising the perovskite crystals are added to the solution, subsequently by addition of a further substance, for example a further liquid. The coated particles comprising perovskite crystals are precipitated and finally, the at least one first solvent and the further substance are removed, for example, by suction, filtration or evaporation of the solvents, etc. Suitable substances for dissolving and precipitating are herein not restricted and can be suitably selected according to the purpose of the use and can also comprise mixtures. Thus, for example, on use of P3HT and/or PCBM, chloroform can be used as the solvent and ethanol as the precipitating agent.

In some embodiments, the nuclei comprising perovskite crystals are not soluble in the first solvent. The semiconductor material may comprise at least two semiconductor compounds. In some embodiments, the suspension of the nuclei comprising perovskite crystals is continuously mixed/stirred during the processing. This can be achieved, for example, in that the suspension is subjected to ultrasonic waves to ensure a better distribution of the nuclei comprising perovskite crystals. In some embodiments, the nuclei comprising perovskite crystals can therefore be added to the solution while the solution is subjected to ultrasonic waves.

In some embodiments, the nuclei comprising perovskite crystals clump together during the precipitation and are obtained as a voluminous mass, since by this means, coated particles comprising perovskite crystals are still obtained. In some embodiments, however, the coated particles comprising perovskite crystals can also be obtained individually, which can be controlled, for example, by means of the concentrations of the reagents used in solution or suspension.

In some embodiments, dispersants, ligands for the scintillator particles or further additives can also be used, which can then be removed again from the surface of the coated particles comprising perovskite crystals by the use, for example, of ultrasound before the precipitation. In some embodiments, no additives are included, to avoid negatively influencing the semiconductor materials.

In some embodiments, the coated particles comprising perovskite crystals are ground to a powder following the removal of the first solvent and the further substance. Herein, care is taken that only cohering coated particles are separated and the covering of the coated particles is not attacked, which can be achieved by the selection of a suitable grinding process, for example wet grinding and subsequent drying. Normally, however, following the separation of the solvent, it is sufficient simply to grind the particle mass obtained to a flow-capable homogeneous powder in a mortar. In some embodiments, the powder consists of powder granules with a diameter of 0.01 to 200 µm, e.g., 0.5 to 100 µm, or from 1 to 10 µm. In the case of excessively large powder granules, compaction during the production of inventive detectors can be made more difficult, whereas with powder granules that are too small, the method can become too complex. In some embodiments, particle granules have a diameter from 1 to 10 µm, wherein the particle diameter can be determined based upon optical (high-resolution microscope, dynamic light scattering/DLS), electron microscopic or electrical analysis (e.g., Coulter counter).

In some embodiments, the structure is already formed in the solution. By this means, the material input can be controlled better and new possibilities for processing arise from the dry phase. The method is also distinguished by a good processing capability during the production of thick layers in detectors (no drying cracks from escaping solvent), and the associated health and environmental advantages.

The production of the coated particles comprising perovskite crystals can take place, for example, on the basis of the process shown in FIGS. 5 to 9.

Firstly, herein the nucleus comprising perovskite material, e.g., suitable monocrystalline or polycrystalline powder, for example, a perovskite crystal 36 is produced. At the time point t1 (FIG. 5), the introduction of the starting materials of the perovskite, a first starting material 34, for example $PbI_2$, and a second starting material 35, for example, an organic ammonium iodide such as methylammonium iodide are successively placed in a vessel 31 with a third solvent which can be temperature-controlled by means of water 32 and is subjected to ultrasound in an ultrasonic bath 33. Thereafter, at the time point t2 (FIG. 6), the perovskite crystal formation, perovskite crystals 36 or crystals with a perovskite lattice structure form above a particular concentration of the dissolved starting materials and sink to the bottom of the vessel 31. At the time point t3 (FIG. 7), the precipitation of the perovskite crystal particles, by addition of a fourth solvent, the remaining starting materials 34, 35 are precipitated to perovskite crystals 36 and are subsequently isolated. Through the simultaneous action of ultrasound, a homogeneous microcrystallinity can be ensured.

Through the suitable selection of the fourth solvent, the yield of the respective reaction product in the perovskite structure can be increased to >99% once it has been suction extracted under inert conditions and the powder dried. Subsequently, the powder is used for production of the coated particles wherein, following the production, the size of the particles in the powder can lie in the range 0.1-100 µm (e.g., 1-10 µm).

An alternative production of particles with a scintillator nucleus can take place similarly to the process illustrated in FIG. 5. The scintillator and the materials for forming a perovskite lattice structure are herein homogeneously dispersed in a third solvent by means of ultrasound. Through the use of the ultrasound for dispersing the scintillator, the use of a ligand shell to prevent clumping can be dispensed with. The scintillator particles simultaneously serve as nuclei of crystallization, on the surface of which the crystalline layer is deposited adhesively in the modification of the perovskite lattice. By the addition of a fourth solvent and ultrasound treatment, a very homogeneously particulate material in a rapidly precipitating suspension is obtained. Following removal of the solvent under inert conditions and drying in an inert gas stream a, for example, grey-black powder (on use of $PbI_2$ and methylammonium iodide) in a yield of >99% is obtained.

The proportion by weight of the scintillator particles as compared with the perovskite starting materials herein determines the "grey value" of the powder and can vary from greater than 0:1 to 5:1. The thickness of the absorbing, crystalline shell is adapted to the absorption length of a photon in this layer. The absorption length of green light in this crystalline layer is typically 250 nm. A thicker covering would therefore not improve the absorption properties.

In some embodiments, the mixing ratio of the perovskite and the at least one scintillator and thus the starting materials in the nucleus is 4:1 to 1:10, e.g., 1:1 to 1:4, related to the weights of the respective components. The mixing ratios (in weight %) are influenced herein by the absorption coefficients of the perovskite in the emission maximum of the scintillator and the density of the material.

In order to create the covering from semiconductor round the nucleus comprising perovskite crystals or round the scintillators covered with perovskite, the above described particles are further processed as follows (FIGS. 8 and 9, time points t4 and t5):

The semiconductors (at least one) are dissolved at the time point t4 (FIG. 8), the introduction of the perovskite crystal particles into a first solution comprising the at least one semiconductor, in a first solvent and the perovskite crystals 36 or perovskite-coated scintillators are dispersed therein, for example, with continuous stirring and/or with ultrasound. If relevant, by means of the ultrasound treatment, a clumping of the starting materials can also be broken up. It is herein not necessary that the nuclei comprising perovskite particles or the scintillators covered with perovskite should be surrounded by a ligand shell, since a distribution of the particles is ensured by the stirring.

Subsequently, at the time point t5 (FIG. 9), the precipitation of the coated particles, through the addition of a further substance, for example, a second solvent in which the semiconductor material is not soluble, the perovskite crystals 36 are precipitated, for example, as particles together with the semiconductors, so that they form a covering round the dispersed particles. The nuclei comprising perovskite particles or the scintillators covered with perovskite act herein as condensation nuclei round which the semiconductor material can become deposited. Subsequently the solvents can be separated out, for example suction extracted, and the thus isolated coated particles 37 can be used for the production of a component, for example, a detector. The thickness of the covering to be striven for of semiconductor lies in the range 0.01-1 µm, e.g., 0.05-0.5 µm.

The quantities of perovskite and scintillator for producing the coated particles comprising perovskite crystals and scintillator nuclei can be derived, for example, on the basis of the following considerations:

Shell Thickness and the Starting Quantities Needed:

The volume of scintillator nucleus and perovskite shell is made up of the scintillator nucleus $V_{scintillator}$ and the coating volume of the perovskite crystals $V_{perovskite}$. To measure out an optimum ratio, the density of the perovskite crystals $\rho_{perovskite}$ and of the scintillator $\rho_{scintillator}$ are needed in order to arrive at the respective weight $W_{perovskite}$ and $W_{scintillator}$.

Total volume ($V_{total}$) of the layer, for example, detection layer:

$$V_{total} = V_{perovskite} + V_{scintillator} = \frac{W_{perovskite}}{\rho_{perovskite}} + \frac{W_{scintillator}}{\rho_{scintillator}}$$

To emphasize the distinctive ratios of the volumes and the quantities, these are given in volume-percent and quantity-percent in comparison with the total volume and quantity. The following two formulae illustrate this.

Volume-percentage proportion of the perovskite ($V_{perovskite}\%$)

$$V_{perovskite}\% = 100 \cdot \frac{V_{perovskite}}{V_{total}}$$

Quantity-percentage proportion of the perovskite ($W_{perovskite}\%$)

$$W_{perovskite}\% = 100 \cdot \frac{W_{perovskite}}{W_{scintillator} + W_{perovskite}}$$

The shell volume of perovskite sought is obtained via the desired absorption of the perovskite. The absorption can be adjusted by means of the layer thickness $r_{perovskite}$ of the shell volume and thus by the absorption length of the emitted light. The shell volume is made up from the total volume with the radii $r_{scintillator}$ and $r_{perovskite}$ minus the inner sphere, the scintillator. It can be calculated as follows.

Shell volume sought ($V_{perovskite}$) and thickness ($r_{perovskite}$)

$$V_{perovskite} = \frac{4\pi}{3}((r_{scintillator} + r_{perovskite})^3 - (r_{scintillator})^3)$$

In some embodiments, the layer, e.g., detection layer, has a thickness, regardless of whether scintillators are contained therein or not, such that at least 50%, at least 70%, or at least 90% of an incident radiation in the range from 3.3 eV to 10 MeV is absorbed. The absorption of the incident radiation can herein simply be determined for a particular material of the layer by absorption spectrometry with different thicknesses and the corresponding layer thickness can be determined by subsequent calculation based on known formulae or by graphical determination.

In some embodiments, a detector, in particular an X-ray detector, gamma detector or UV detector or a solar cell, comprises particles coated according to the invention. The detector or the solar cell comprises a substrate with a first electrical contact and optionally at least one first intermediate layer, a layer comprising the inventively coated scintillator particles, optionally at least one second intermediate layer and a second electrical contact.

The substrate is not particularly restricted and can comprise all substrates which are normally used in X-ray detectors, gamma detectors or UV detectors or solar cells. Thus, it can comprise, for example, glass, e.g. coated with indium tin oxide (ITO), aluminum zinc oxide, doped zinc oxide, silicon, etc. Substrates such as metal films or polymer films also come into consideration.

In some embodiments, the substrate can have a first electrical contact such as a metal, for example, Cu, Ag, Pd, Pt, Cr, Au or Al, ITO, aluminum zinc oxide, doped zinc oxides, etc., and optionally a first intermediate layer as is present, for example, in electro-organic components. The material of the electrodes and/or of the substrate is herein oriented to the use as an X-ray detector, gamma detector, or UV detector, or as a solar cell, wherein different materials are used for the detection of these different radiation types or the conversion of solar radiation into current, since they are to be transparent to the radiation. Thus, for example, Al is not suitable for UV.

In some embodiments, the material of the electrodes and/or of the substrate reflects the light emitted by the coated particles. By means of the reflective effect of the contacts on the emitted radiation, it can be achieved that emitted light does not escape from the active zone. In some embodiments, the first electrical contact and/or the second electrical contact and/or the substrate therefore comprises or consists of a material which reflects the emitted radiation of the coated particles according to the present invention. Exemplary metals include Au, Ag, Pd, Pt, Al, Cr, and/or Cu, although a large number of further materials are known, so that the materials of the electrical contacts are not further restricted, so that they reflect the emitted radiation from the scintillator particles. By means of the corresponding embodiment, the detected signal of the detector can be further improved.

The layer comprising the inventive coated scintillator particles may comprise only the coated particles or in addition another material, for example, for filling gaps during compaction.

In some embodiments, the detector can optionally contain intermediate layers/interlayers to improve the transition between the active layer and the contact layers and can thus further minimize the contacting of the sample and further minimize leakage current or dark current. These interlayers are typically hole-conducting, preferably organic, semiconductors or electron-conducting organic semiconductors. As hole-conductors, for example, PEDOT:PSS, P3HT, MDMO-PPV, MEH-PPV, TFB and polyTPD or p-doped $MoO_3$ can be used, whereas as electron conductors PCBM, C60, 3TPYMB or n-doped ZnO can be used.

For example, inorganic intermediate layers/interlayers can also be used, for example, ZnO or TiO. As interlayers, very thin layers (a few nanometers) of insulating materials (e.g., $Al_2O_3$, $SiO_2$, $Si_3Ni_4$) can be used. The intermediate layers/interlayers can be adapted to the semiconductor material of the coated particles.

In some embodiments, a layer, in particular for the detection of X-ray radiation, gamma radiation, or UV radiation, or for a solar cell, may include inventive coated particles. For example, an X-ray detection layer comprising the inventive coated particles which is also present in the inventive detector or the inventive solar cell, is highly resistive in the non-radiated state of the detector and becomes conductive through the irradiation of the detector. By this means, an additional signal improvement is produced during detection, since the background noise can also be minimized.

The conditions for high resistivity are herein as follows. With thin diodes, the resistance of the diode in the non-conducting direction is substantially given by the contact resistance. This ensures that low dark currents are achieved. For the use of a photodetector in the field of medical X-ray imaging, a dark current of not more than 1e−05 mA/$cm^2$ is required. This corresponds, at a −1 V reverse voltage to 1e8 Ohm for a detector with an area of 1 $cm^2$. With thicker diodes, as can be present here by way of example, the layer resistance begins herein to play an increasing role. The resistance of the diode then increases with increasing layer thickness and a specific resistance can be stipulated. For a 100 μm thick layer, a dark current of 1e−6 mA/$cm^2$ is to be striven for, which corresponds to a specific resistance of 1e−11 Ohm×cm. Accordingly, "highly resistant" in the context of the invention signifies that the specific resistance of the layer corresponds to at least 1e−9 Ohm×cm, preferably 1e−11 Ohm×cm.

The area of the layer, for example, detection layer is adapted according to the invention to the use and, for human medical uses is, for example, between 2×2 $cm^2$ (e.g., for dental imaging), 20×20 $cm^2$ (e.g., for mammography) up to 43×43 $cm^2$ (e.g., for lung imaging). For uses in industrial measuring technology or veterinary medicine, the area of the detectors can also be smaller or larger.

In some embodiments, a method for producing a detector, in particular an X-ray detector, a gamma detector or a UV detector or a solar cell, includes:
a) provision of a powder comprising coated particles as described above;
b) application of the powder to a substrate with a first electrical contact and optionally at least one first intermediate layer;
c) application of pressure and optionally temperature for compaction of the powder;
d) optionally application of at least one further intermediate layer; and
e) application of a second electrical contact.

In some embodiments, a method for producing a layer comprising the particles coated according to the invention, includes:
a) provision of a powder comprising the coated particles;
b) application of the powder to a substrate; and
c) application of pressure and optionally temperature for compaction of the powder.

To produce a detector or a solar cell or a layer, for example a detector layer, the material loss can be reduced to a minimum as compared with methods for spraying or spinning-on. It is also possible to vary the density of the sintered or compacted layer by means of pressure. This is a particular parameter, in particular, where X-ray absorbing layers are concerned. It is possible, with this method, to achieve much greater densities as compared with spraying, spinning-on or blade coating, which has a positive effect on the layer thickness required. The thinner the layer, the lower is the voltage that must be applied in order to achieve a particular electrical field strength. Thicker layers also have, for example, a greater X-ray absorption and improved electrical conductivity.

Herein, the substance to be processed comprising the coated particles is applied as a powder, e.g., as a dry powder, onto the respective base/substrate to be coated and is subsequently compressed with the application of pressure, for example, unidirectionally, e.g., with a stamp, a roller, etc., or isostatically, for example, by means of a liquid (e.g., oil) placed under pressure, at a particular sintering temperature, for example, e.g., at temperatures of 20-25° C., and a sintering time or compaction time. Herein, the particles of the starting material become compressed and the pore spaces are filled. Both solid phase sintering, material compaction without melting the powder with the inventively coated scintillator particles, as well as liquid phase sintering, material compaction by means of melting-on of the powder (e.g., directly at the contact surface between the sintering stamp and the semiconductor surface) are included. Through the compaction of the molecules by means of pressure and possibly temperature, the intermediate spaces are minimized and compressed such that on application of an electric voltage, electrical charge transport via, for example, hopping processes or redox processes between the individual molecules or polymer strands is possible. In this way, homogeneous, for example organic, material layers of high (and also low) layer thickness without complex vacuum process technology at a high throughput and without health risks from possible solvents are realizable.

The application of pressure is not particularly restricted and can be achieved by means of suitable devices. In some embodiments, the pressure is exerted by the use of a stamp or a roller which are preferably coated with an anti-adhesion coating, for example, PTFE (polytetrafluoroethylene) or similar materials belonging to the group of polyhalogen olefins (e.g., Teflon®). By means of the covering with an anti-adhesion coating, for example, PTFE (polytetrafluoroethylene) or similar materials belonging to the group of polyhalogen olefins (e.g., Teflon®), in particular, very homogeneous surfaces of the layer can be achieved. The use of stamps and/or rollers can also be implemented easily through process engineering. The material of the stamp or the roller is not particularly restricted and can comprise, for example, aluminum, steel, PVC or PTFE (polytetrafluoroethylene) or comparable materials belonging to the group of polyhalogen olefins (e.g., Teflon®). According to particular embodiments, the pressure is applied isostatically by means of a liquid placed under pressure (e.g., oil), which can result in simpler processing.

The pressure that is applied is not particularly restricted, provided a sufficient compaction or sintering is brought about. In some embodiments, a pressure of from 0.1 to 10,000 MPa, more e.g., 0.5 to 500 MPa or from 1 to 200 MPa is applied. The sintering time is also not particularly restricted and, according to particular embodiments, is 0.1 s to 60 min, e.g., 1 s to 30 min or 5 to 15 min. With an excessively long sintering time or compaction time, no better results are achieved and a worsening of the material properties can come about, whereas excessively short sintering times or material compaction times cannot achieve sufficient compaction/sintering of the layer.

In some embodiments, the substrate is heated in step c) before the application of the pressure for compaction of the powder, for example, to a temperature of 30 to 300° C., e.g., 50 to 200° C. By this means, the sintering process or the compaction can be improved.

The layers produced can be verified and characterized based upon the morphology and the surface structure of the sintered or compacted layer (possibly regions melted on individually or over the whole surface). Possibly, indirect conclusions can also be drawn regarding a sintering process, for example, due to the lack of solvent traces, additives, and dispersants. The following come into question as investigation methods: optical microscopy, scanning electron microscopy, atomic force microscopy, secondary ion mass spectrometry, gas chromatography, cyclovoltammetry, etc.

In some methods for producing a detector or a solar cell, the substrate is not particularly restricted and can comprise all substrates which are normally used in such components. Thus, it can comprise, for example, glass, indium tin oxide (ITO), aluminum zinc oxide, doped zinc oxide, silicon, etc. In some embodiments, the substrate can have a first electrical contact such as a metal, for example, Cu or Al, ITO, aluminum zinc oxide, doped zinc oxides, etc., and optionally at least one first intermediate layer as is present, for example, in electro-organic components.

Alternatively, the layer, for example detection layer, can be applied onto a temporary substrate (e.g., glass or polymer film) and subsequently lifted therefrom in order to be further processed as a self-supporting layer, for example during the production of detectors such as X-ray, UV, or gamma detectors, or solar cells. For example, the self-supporting layer can have a metal film applied to the underside and the upper side and then baked or welded in.

In some embodiments, additional semiconductor material can be added to the coated particles before the application of pressure or the sintering in order to be able better to fill the pore spaces between the coated particles. In particular embodiments, for example, a further component such as a secondary p-type donor polymer can also be added.

In some embodiments, the coated particles are provided as a powder, wherein the powder is not further restricted. In some embodiments, the powder is provided as a dry powder, wherein a little solvent can also be added to it according to particular embodiments, for example, with less than 10 wt-% or less than 5 wt-% related to the mass of the powder. If a little solvent is added to the powder, it can become sticky, through which its processing, for example, on application to the substrate can be simplified and also thereby possibly less heating of the substrate may be necessary.

In some embodiments, the powder consists of particles comprising the coated particles of powder nuclei with a diameter of 0.01 to 200 µm, e.g., 0.5 to 100 µm, or from 1 to 10 µm. In the case of excessively large powder nuclei, compaction can be made more difficult, whereas with powder granules that are too small, the processing can be made more difficult. The particle diameter can be determined, for example, with a sieve analysis and corresponding sieves with holes from 1 to 10 µm can be used.

Following the production of the layer in step b) and/or c), in the method for producing the detectors or solar cells, optionally, at least one second intermediate layer in step d) and then a second electrical contact (metal such as Al, Cu or ITO, aluminum zinc oxide, doped tin oxides, etc.) can be applied in step e) and these can then also be sintered or compacted. Alternatively, optionally at least one second intermediate layer and then a second electrical contact can also be applied by other method steps such as vapor deposition, spraying, etc. The second electrical contact can, for example, also be applied as a solid layer by gluing. In addition, the second electrical contact can also serve as a new sublayer/new substrate on which again a new layer can be applied. Thus, multi-layered structures are also included. A layer comprising the coated particles can be applied to a layer comprising other coated particles, so that here also multiple layers can arise which can be sintered separately from one another or also together.

In some embodiments, the layer comprising the coated particles can also be applied to a substrate which comprises no electrode material, for example glass, and electrical contacts can then be applied laterally relative to the powder in step b) or relative to the powder in step b) or to the compacted powder in step c), that is, for example, also onto the substrate alongside the layer.

In order to be able to localize the layer more precisely on the substrate, the application of the powder can be delimited locally, for example, using a frame, e.g., a frame which is coated at least on the inside with an anti-adhesion coating, for example PTFE (polytetrafluoroethylene) or similar materials of the class of polyhalogen olefins (e.g., Teflon®). The form of the frame is herein not particularly restricted and can be round/annular, oval, square, rectangular, or some other shape. The height of the frame is also not further restricted, but may have a height such as the thickness of the layer which is to be produced, or a greater height.

Thus, following the production, the layer can have a thickness of at least 1 µm, e.g., at least 10 µm or at least 100 µm. In the upward direction, the thickness of the layer is dependent on the intended purpose, it can also be multiple 100 µm (for example, X-ray detectors) or more. The material of the frame is not particularly restricted and can comprise, for example, aluminum, steel, PVC, PTFE, or Teflon®.

Through pressing and compaction, the individual particles touch so that continuous current paths can be formed in both phases (perovskite and semiconductor) in the pressed layer, on which the charge carriers generated can flow to the contacts. The pressed layers may have elevated charge carrier extraction due to the use of the perovskite in the coated particles, by reason of the increased charge carrier mobility which the organic semiconductor materials do not have.

FIG. 10 shows the layer structure of an exemplary component following the compaction, which can be used for example, for X-ray detection. Herein, on a substrate 42 such as glass, a first electrode 43 is shown, for example Al or ITO or another material on which a layer 41 comprising the coated perovskite crystal particles and thereon a second electrode 44, for example, again Al or ITO or another material is situated.

As shown in FIG. 11, in a component, for example, an X-ray detector, interlayers/intermediate layers 45, 46 can also be provided which are the same or different. These can be inserted between the two electrodes 43, 44 and the pressed layer 41 comprising the coated perovskite crystal particles, optionally both or also only one layer 45, 46 each between the upper electrode 44 and the layer 41 comprising the inventively coated perovskite crystal particles or between the lower electrode 43 and the layer 41 comprising the inventively coated perovskite crystal particles. The additional intermediate layers 45, 46 can lessen or prevent an injection of charge carriers from the electrodes 43, 44 into the pressed layer 41, which results in a smaller leakage current (dark current) in the component. The additional intermediate layers 45, 46 can also improve the charge carrier extraction. In exemplary X-ray detectors, hole-conducting (e.g., PEDOT:PSS, P3HT, TFB, MEH-PPV, p-doped $MoO_3$) or electron-conducting (e.g. PCBM, C60, 3TPYMB, n-doped ZnO) semiconductors can be used as the intermediate layer. Very thin layers (a few nanometers) of insulating materials (e.g. $Al_2O_3$, $SiO_2$, $Si_3Ni_4$) or self-organizing layers, so-called SAMs (self-assembled monolayers) such as for example PEIE (ethoxylated polyethylenimine) can also be used as interlayers. As an interlayer, it can be used as a hole blocker (electron conductor) (See, e.g., Koh et al., JOURNAL OF APPLIED PHYSICS 113, 174909 (2013)).

The sintering or compaction can take place, for example, unidirectionally, e.g., by means of rolling or isostatically, wherein the substrate can be applied to a hot plate and thereupon a lower electrode, e.g., ITO, Au, Cr, Cu, Ag, Pt and thereupon the layer of coated particles. The pressure can be applied, for example, by means of a pressing mold which fits into a filling ring/frame 76, wherein the pressing mold can optionally be heated. In the case of rolling with a roller which is also optionally heatable, the speed, temperature, and pressure are the most important parameters. Before the rolling, the flowable semiconductor material comprising the coated scintillator particles can be homogeneously coated dry, for example, by means of a spreading blade, onto the substrate in a correspondingly greater thickness. In the case of stamping, the temperature, pressure, and time are the decisive parameters.

Following the sintering or compaction, for example, an aluminum cathode (layer thickness ca. 200 nm) or another electrode can be vapor deposited onto the sintered layer by means of physical gas phase deposition. Alternatively, it can be shown that it is possible, as early as during the sintering process, to introduce a piece of stamped out aluminum foil as a top contact/upper electrode. Two different powders of the coated particles can also be layered over one another and pressed together.

A further embodiment of a "sintering machine" for a roll-to-roll process can be a "heatable rolling mill". Machines which perform something similar, for example, in the form of electrophotographic machines (copiers and laser printers) can be adapted accordingly. In a copier, for example, for producing such layers, for example, detection layers with the coated particles on flexible substrates, a cartridge with a material having the described coated particles can be provided. The image drum of a copier is herein electrostatically charged by a charging device, light from a light source which maps the structure desired to be formed is reflected by the pattern, as during copying, and via, for example, a lens, is thrown onto the image drum and thus correspondingly, image regions are formed on the image drum by extinguishing of the charge with the reflected light. Now, the material with the particles coated as described is applied by means of the cartridge onto the image drum and is applied onto the substrate charged by the charging device, wherein the substrate can be guided by the image drum and a counterroller. As a fixing unit, heated rollers can be provided, which sinter on the material at, for example 140-180° C. All the materials of the inventive sintering process are electrostatically active and could be applied from (toner) cartridges. Electrodes can also be applied in this manner.

For non-flexible substrates, an adequate arrangement of the copier module can take place via a liner substrate transport. The manufacturing and efficient production of layer systems can thus be carried out by means of R2R processes (for example, multiple passes of the substrate in a sinter cascade).

The manufacturing method for the detectors or solar cells in contrast to the solution-based process techniques arises from the material powder that can be synthesized in any desired quantities. Herein, the synthesis takes place effectively loss-free and the powders can be stored for as long as desired. By this means, the material input can be controlled better and new possibilities for processing arise. The use of an ultrasonic device for dispersing enables, as compared with manual stirring, a more homogeneous, finer monocrystalline or polycrystalline powder. The crystallinity of the powder before the, preferably organic, semiconductor covering is applied can be tested optically since, for example, in the case of $PbCH_3NH_3 I_3$, crystalline powder with a perovskite lattice structure appears black, whereas amorphous powder appears yellowish.

The powder produced with this method enables a relatively simple processing, particularly of relatively thick layers, since no drying cracks arise due to emerging solvent. In addition, health and environmental advantages result therefrom. Through the processing by means of stamping or rolling, the material loss is reduced to a minimum as compared with methods such as spraying or spinning-on. By means of the pressure of the stamp or the roller, the density of the layer produced can be varied, which is advantageous primarily for X-ray absorbing layers. In comparison with spraying, spinning-on or blade coating, the density can be increased, so that the layer thickness necessary for the same absorption of X-ray radiation is thinner. Lower voltages are also sufficient to generate the same electrical field strength in the component.

Some embodiments include the use of the coated particles for the detection of high-energy radiation, e.g., UV radiation, gamma radiation, and/or X-ray radiation and the use of the coated particles in solar cells.

The above embodiments, configurations, and developments can be combined with one another as desired, wherever useful. Further possible configurations, developments, and implementations also include not explicitly mentioned combinations of features described above or in the following in relation to the exemplary embodiments. In particular, a person skilled in the art would also draw upon individual aspects as improvements or enhancements of the respective basic form of the present teachings.

Details relating to the synthesis of exemplary coated particles comprising perovskite crystals or of scintillators coated with perovskite and the formation of a layer, for example detection layer, according to a first exemplary embodiment, are given below.

For the manufacturing of a homogeneous powder from monocrystalline or polycrystalline materials in a perovskite lattice or a perovskite coating of a scintillator as the nucleus and at least one semiconductor as a coating for the layer formation of an X-ray absorber can be performed as follows. In some embodiments, all the materials and solvents are prepared, cleaned, and oxygen-free, in a glove box or under adequate conditions and also all operations as far as the ready-made ready-to-use material mixture are carried out under such conditions.

Through the addition of a polar, third solvent, for example methanol, in a round-bottomed flask, the starting materials lead-II-halide and a suitable ammonium halide, for example, methylammonium chloride present in the same stoichiometric ratio are partially dissolved at a room temperature of 20 to 22° C. A suspension-like mixture arises simultaneously with the formation of deeply-colored (mostly black) perovskite crystal particles. The formation of the perovskite crystals is completed by means of ultrasonic treatment. By this means, an almost constant particle size of the resultant powder is produced. To crystallize residues of the material still in solution, a fourth non-polar solvent, such as diethyl ether, is now added which leads under ultrasonic conditions to the complete crystallization of the remaining starting materials contained in the solution as black monocrystalline or polycrystalline particles. Through the addition of the fourth solvent, a very homogeneous suspension produced by means of sonography is obtained, which rapidly precipitates and is very well suited to vacuum filtration. An aftertreatment of the dried filtrate with a mortar or a vibrating ball mill for delimiting the particle size distribution is not necessary since the powder produced is sufficiently homogeneous. The yield is almost quantitative, at >99%.

The underlying procedures for the manufacturing of a powder consisting of an X-ray absorber or scintillator as the nucleus with a coating having a monocrystalline or polycrystalline perovskite material for preparation are similar to the above exemplary method. In addition to the starting materials which form the perovskite lattice, scintillator particles, for example $Gd_2O_2S$:Tb are also added to the round-bottomed flask, for example, in the desired mass ratio of 1:1 (relative to the quantity of the resulting perovskite crystals).

The powder produced from pure perovskite crystal particles or scintillator nuclei coated with perovskites serve as starting materials for the coating with at least one, preferably organic, semiconductor. The semiconductors (at least one) are dissolved in a first solvent (e.g., chloroform) and the previously manufactured particles are dispersed therein (optionally with ultrasound). Subsequently, with the addition of a second solvent (e.g., diethyl ether), the particles are precipitated together and subsequently isolated.

The formation of the coated particles begins immediately on addition of the solvent so that, for example, a gray-black particle mixture of homogeneous composition forms, the "gray value" of which depends, for example, on the proportion of the scintillator.

Figure 12:
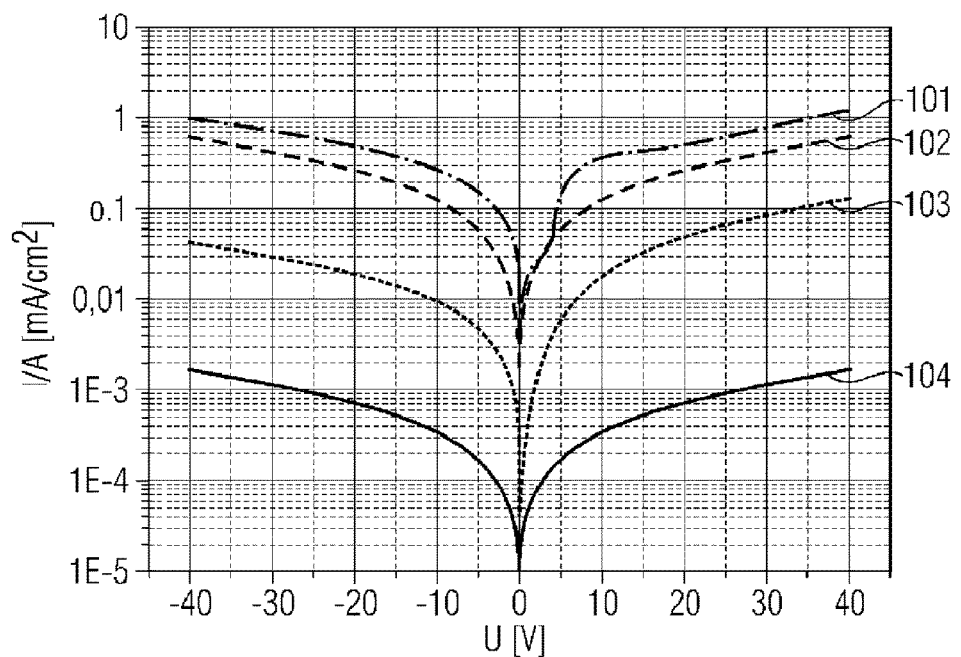
FIG. 12 shows current-voltage characteristic curves of detectors comprising the inventive coated particles in accordance with an exemplary embodiment of the present invention and compares them with others not having these particles in accordance with comparison examples.

FIG. 12 shows the current-voltage characteristic curves of an exemplary detector as compared with examples, wherein in the diagram, the voltage is given in volt and the dark current density in $mA/cm^2$. The structure of the detector in the comparative examples (lines 101 to 103) and the example (line 104) with regard to layer thicknesses, areas, process parameters during manufacturing, was as follows:

The detector represented in comparative example 1 by the line 101 (top in the diagram) had ITO as the lower contact, followed by a 100 μm-thick pressed perovskite layer ($CH_3NH_3PbI_3$), which was manufactured by means of a pressure of 100 kg on a 75 $mm^2$ area for 15 minutes at 120° C. Subsequently, a 300 nm-thick aluminum layer was provided as the upper contact.

Typically, the temperature during the pressing procedure can lie, for example, between 50° C. and 300° C., preferably between 80° C. and 200° C. The pressure can be selected to be, for example, between 0.1 and 500 MPa, preferably between 1 and 100 MPa.

Comparative example 2, to which the line 102 is assigned, has the same layer structure as in comparative example 1, although a 100 nm-thick PEDOT:PSS layer was additionally applied as an electron blocker between the ITO and the perovskite layer.

The structure in comparative example 3 to which the line 103 is assigned, has the same layer structure as in comparative example 2, although a 360 nm-thick PCBM layer was additionally applied as a hole blocker between the perovskite layer and the aluminum electrode.

The layer structure in example 1, to which the line 104 at bottom on the graph is assigned, corresponds to that of comparative example 2 wherein, in place of the perovskite layer, a layer with coated perovskite particles (core-shell structure: $CH_3NH_3PbI_3$-nucleus with PCBM covering in the weight ratio of 1:2 of the same thickness was provided. The nucleus diameter was approximately 3-8 μm.)

The area of the samples of comparative examples 1 to 3 and example 1 was 10 $mm^2$ in each case. The PEDOT:PSS interlayers (thickness ~100 nm) were spun onto the substrate and subsequently baked at 200° C., and PCBM was sprayed on at 2 bar (thickness ~300 nm).

FIG. 12 shows the improved voltage-current characteristics of example 1 as compared with the comparative examples. In general, using the methods taught herein, detector layers of 60-800 μm have previously been realized.

Figure 13:
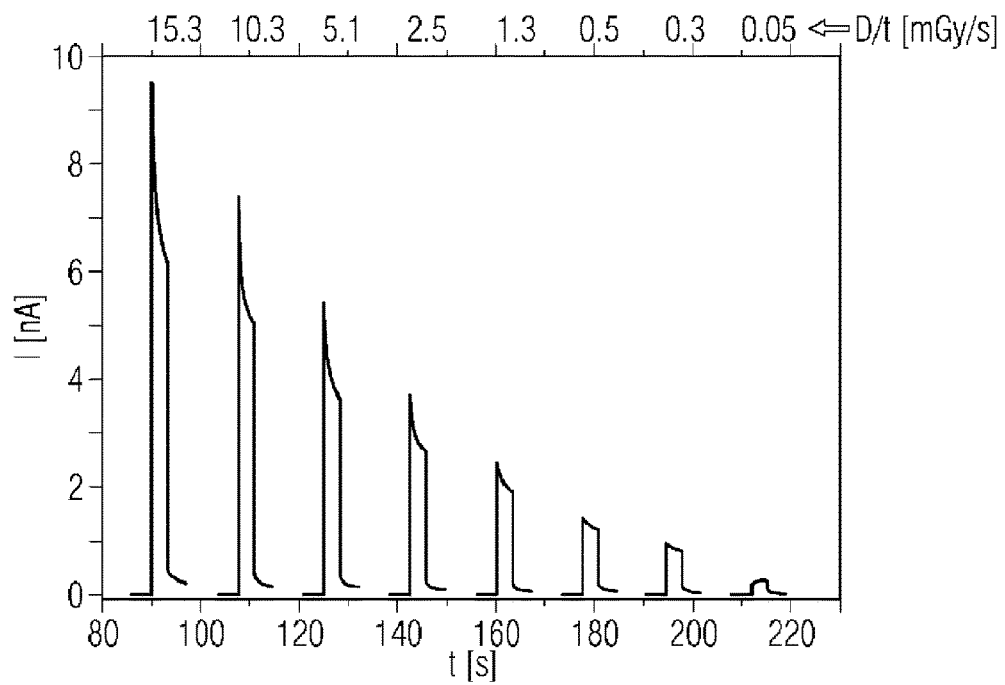
FIG. 13 shows the pulse responses to X-ray radiation with different dosage rates for a detector according to teachings of the present disclosure.

FIG. 13 shows the response of the detector of example 1 to X-ray pulses of different dose rates as the current I. The sample was herein irradiated with a Siemens Megalix X-ray tube at an accelerating voltage of 70 kV and a 2.5 mm aluminum filter at a pulse duration of 3 s. The anode stream was varied between 1 and 300 mA to generate different dose rates. The measurement demonstrates that a sensitive detection of X-ray radiation and a rapid response behavior of the components can be realized in the region of 100 ms.

Figure 14:
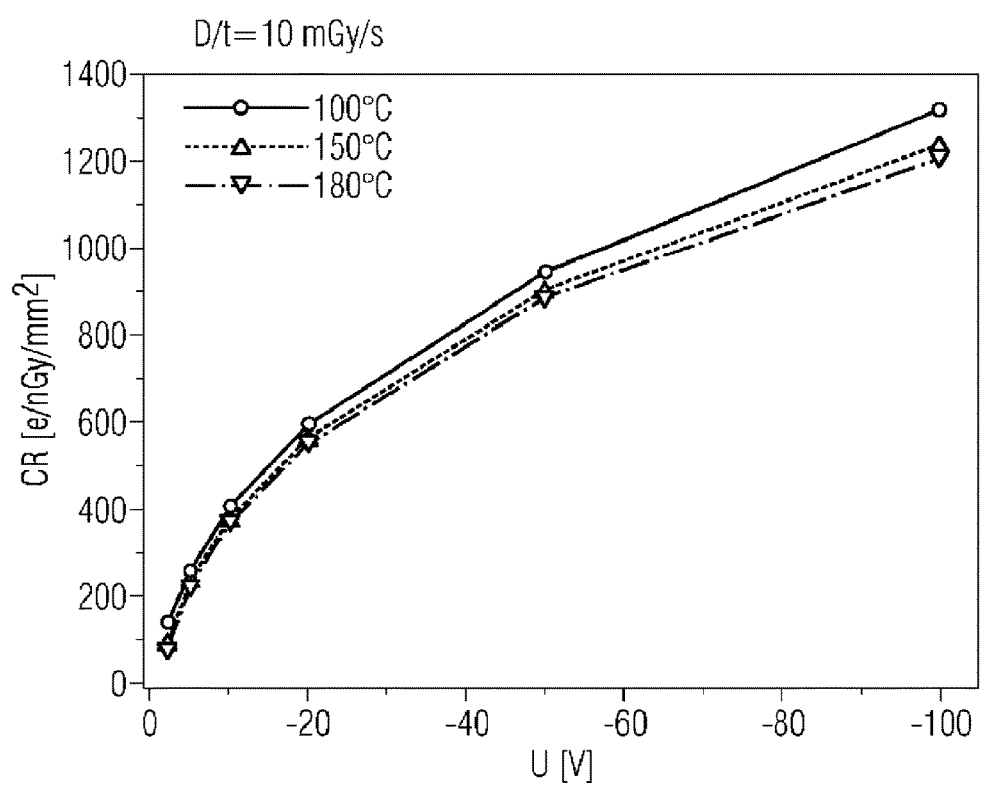
FIG. 14 shows measurement results of conversion rates of an example detector.

FIG. 14 shows further results from an example detector, wherein as compared with the detector of example 1, no interlayers were implemented, in order further to reduce the dark current (>0.01 $mA/cm^2$) and potentially to improve the conversion rates. What is shown is the conversion rate CR as a function of the voltage. The voltage-dependent conversion rates for three samples at different pressing temperatures and an irradiating dose rate of 10 mGy/s show the excellent conversion rate of the inventive detectors.

The teachings of the present disclosure provide monocrystalline or polycrystalline powder comprising a perovskite lattice structure wherein the particles comprising a nucleus with perovskite crystals or a nucleus comprising scintillators and perovskite crystals (e.g., in the form of a scintillator core with a perovskite crystal shell) have a covering (coating) of at least one, preferably organic, semiconductor. This powder can be used in thicker layers (e.g., 10-1000 µm) for X-ray detection and in thinner layers (e.g., <500 nm) for use in solar cells. Conventional methods for depositing perovskitic polycrystalline layers for use in solar cells or detectors such as X-ray detectors are solution-based. The structure formation only takes place on the substrate during the drying process and does not enable the production of thicker layers.

Through the covering or coating of monocrystalline or polycrystalline perovskite particles or perovskite covered scintillators with the at least one semiconductor, a significant reduction in the dark current can also be achieved.

In addition, the manufacturing of detectors such as X-ray detectors or X-ray sensitive diodes by means of this powder through a solvent-free sintering process ("soft sintering") is described. These powders are suitable for use in X-ray detectors and enable the manufacturing of thicker absorber layers (e.g., 0.5-1000 µm) from monocrystalline or polycrystalline perovskite powder or with monocrystalline or polycrystalline perovskite-coated X-ray absorbers with a covering of a semiconductor. The material crystallized in the perovskite lattice layer also shows, apart from the absorption of visible light and X-ray radiation, a good electrical conductivity of the charge carrier pairs created and a high mobility up to 50 cm$^2$/Vs.

What is claimed is:

1. A particle comprising:
   perovskite crystals of the type $ABX_3$ or $AB_2X_4$;
   wherein A comprises at least one monovalent, divalent, or trivalent element from the fourth or a higher period in the periodic table or mixtures thereof;
   B comprises a monovalent cation, the volumetric parameter of which is sufficient, with the respective element A, for perovskite lattice formation, the monovalent cation including monovalent amino group-containing, positively charged carbon compounds, amidinium ions, guanidinium ions, isothiuronium ions, formamidinium ions, primary, secondary, tertiary, and quaternized organic ammonium ions; and
   X is selected from the group consisting of halides and pseudohalides, and mixtures thereof; and
   a coating of at least one semiconductor material surrounding a nucleus comprising the perovskite crystals.

2. The particle as claimed in claim 1, wherein the nucleus has a diameter of 0.01 to 200 µm, 0.1 to 100 µm, or 1 to 10 µm.

3. The particle as claimed in claim 1, wherein the nucleus further comprises at least one scintillator.

4. The particle as claimed in claim 3, wherein the at least one scintillator in the nucleus is covered by the perovskite crystals.

5. The coated particle as claimed in claim 1, wherein the semiconductor material comprises at least one electron-conducting material or a hole-conducting material.

6. A method for producing coated particles, the method comprising:
   producing a nucleus of perovskite crystals of the type $ABX_3$ or $AB_2X_4$, where A comprises at least one monovalent, divalent, or trivalent element from the fourth or a higher period in the periodic table and/or mixtures thereof, B comprises a monovalent cation, the volumetric parameter of which is sufficient, with the respective element A, for perovskite lattice formation, the monovalent cation comprising monovalent amino group-containing, positively charged carbon compounds, amidinium ions, guanidinium ions, isothiuronium ions, formamidinium ions, or primary, secondary, tertiary, and quaternized organic ammonium ions, and X is selected from among the halides and pseudohalides;
   coating the nucleus comprising with at least one semiconductor material by:
   bringing the at least one semiconductor material into solution by means of at least one first solvent;
   adding the nuclei comprising perovskite crystals to the solution;
   subsequently, precipitating the coated particles by the addition of a further substance; and
   removing the first solvent and the further substance.

7. The method as claimed in claim 6, wherein the nuclei comprising perovskite crystals are not soluble in the first solvent.

8. The method as claimed in claim 6, further comprising subjecting the solution to ultrasonic waves while the perovskite crystals are added to the solution.

9. The method as claimed in claim 1, further comprising grinding the coated particles to a powder following the removal of the first solvent and the further substance.

10. A detector comprising coated particles comprising:
    perovskite crystals of the type $ABX_3$ or $AB_2X_4$;
    wherein A comprises at least one monovalent, divalent, or trivalent element from the fourth or a higher period in the periodic table or mixtures thereof;
    B comprises a monovalent cation, the volumetric parameter of which is sufficient, with the respective element A, for perovskite lattice formation, the monovalent cation including monovalent amino group-containing, positively charged carbon compounds, amidinium ions, guanidinium ions, isothiuronium ions, formamidinium ions, primary, secondary, tertiary, and quaternized organic ammonium ions; and
    X is selected from the group consisting of halides and pseudohalides, and mixtures thereof; and
    a coating of at least one semiconductor material surrounding a nucleus comprising the perovskite crystals.

11. A method for producing a detector or a solar cell, the method comprising:
    applying a powder to a substrate, the powder comprising coated particles including:
    perovskite crystals of the type $ABX_3$ or $AB_2X_4$;
    wherein A comprises at least one monovalent, divalent, or trivalent element from the fourth or a higher period in the periodic table or mixtures thereof;
    B comprises a monovalent cation, the volumetric parameter of which is sufficient, with the respective element A, for perovskite lattice formation, the monovalent cation including monovalent amino group-containing, positively charged carbon compounds, amidinium ions, guanidinium ions, isothiuronium ions, formamidinium ions, primary, secondary, tertiary, and quaternized organic ammonium ions; and
    X is selected from the group consisting of halides and pseudohalides, and mixtures thereof; and
    a coating of at least one semiconductor material surrounding a nucleus comprising the perovskite crystals;
    wherein the substrate includes a first electrical contact;
    applying pressure for compaction of the powder; and
    applying a second electrical contact.

12. The method as claimed in claim 11, further comprising heating the substrate before applying pressure for compaction of the powder.

13. The method as claimed in claim 11, wherein applying pressure includes use of a stamp or a roller or isostatically.

14. A method for producing a layer, the method comprising:
- applying a powder to a substrate, the powder comprising coated particles including:
  - perovskite crystals of the type $ABX_3$ or $AB_2X_4$;
  - wherein A comprises at least one monovalent, divalent, or trivalent element from the fourth or a higher period in the periodic table or mixtures thereof;
  - B comprises a monovalent cation, the volumetric parameter of which is sufficient, with the respective element A, for perovskite lattice formation, the monovalent cation including monovalent amino group-containing, positively charged carbon compounds, amidinium ions, guanidinium ions, isothiuronium ions, formamidinium ions, primary, secondary, tertiary, and quaternized organic ammonium ions; and
  - X is selected from the group consisting of halides and pseudohalides, and mixtures thereof; and
  - a coating of at least one semiconductor material surrounding a nucleus comprising the perovskite crystals; and
- applying pressure for compaction of the powder.

15. The particle as claimed in claim 1, wherein the at least one semiconductor material coats the particles with a thickness of 1 to 1500 nm, or 10 to 100 nm, or 20 to 50 nm.

* * * * *